(12) United States Patent
Hedler et al.

(10) Patent No.: US 8,004,072 B2
(45) Date of Patent: Aug. 23, 2011

(54) PACKAGING SYSTEMS AND METHODS

(75) Inventors: Harry Hedler, Germering (DE); Juergen Grafe, Dresden (DE); Steffen Kroehnert, Dresden (DE)

(73) Assignee: Qimonda AG, Munich (DE)

( * ) Notice: Subject to any disclaimer, the term of this patent is extended or adjusted under 35 U.S.C. 154(b) by 103 days.

(21) Appl. No.: 12/252,244

(22) Filed: Oct. 15, 2008

(65) Prior Publication Data

US 2010/0090322 A1    Apr. 15, 2010

(51) Int. Cl.
 *H01L 23/495* (2006.01)
(52) U.S. Cl. ................. 257/678; 257/E23.031
(58) Field of Classification Search .......... 257/678, 257/E23.031
See application file for complete search history.

(56) References Cited

U.S. PATENT DOCUMENTS

| | | | | |
|---|---|---|---|---|
| 5,868,887 A | * | 2/1999 | Sylvester et al. | 156/150 |
| 6,079,991 A | * | 6/2000 | Lemke et al. | 439/83 |
| 7,038,325 B2 | * | 5/2006 | Ogino et al. | 257/783 |
| 2007/0241441 A1 | * | 10/2007 | Choi et al. | 257/686 |

OTHER PUBLICATIONS

Hsueh, Chun-Hway, "Modeling of elastic deformation of multilayers due to residual stresses and external bending," Journal of Applied Physics, vol. 91, No. 12 (Jun. 15, 2002).

* cited by examiner

*Primary Examiner* — Benjamin Sandvik
*Assistant Examiner* — Krista Soderholm
(74) *Attorney, Agent, or Firm* — John S. Economou

(57) ABSTRACT

Packaging systems and methods for semiconductor devices are disclosed. In one embodiment, a packaging system includes a first plate having a first coefficient of thermal expansion (CTE). An integrated circuit is mountable to the first plate. The packaging system includes a second plate coupleable over the first plate over the integrated circuit. The second plate has a second CTE that is substantially a same CTE as the first CTE. A plurality of solder balls is coupleable to the first plate or the second plate and to the integrated circuit.

14 Claims, 17 Drawing Sheets

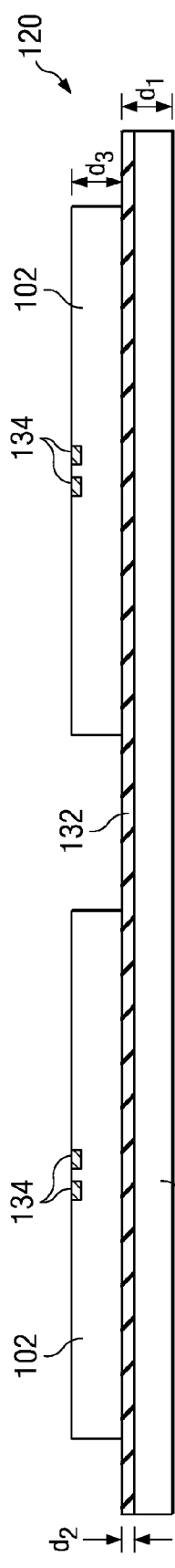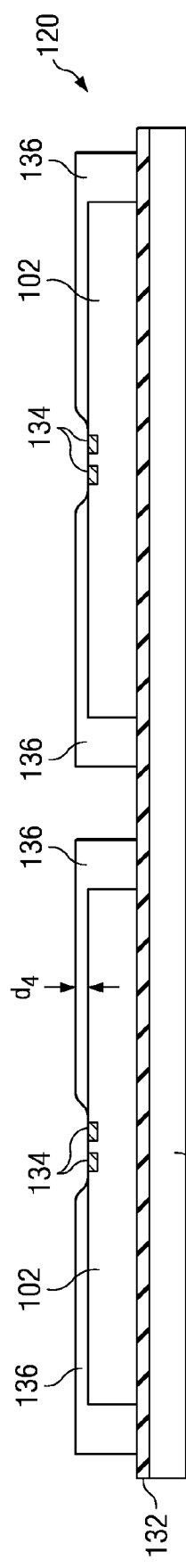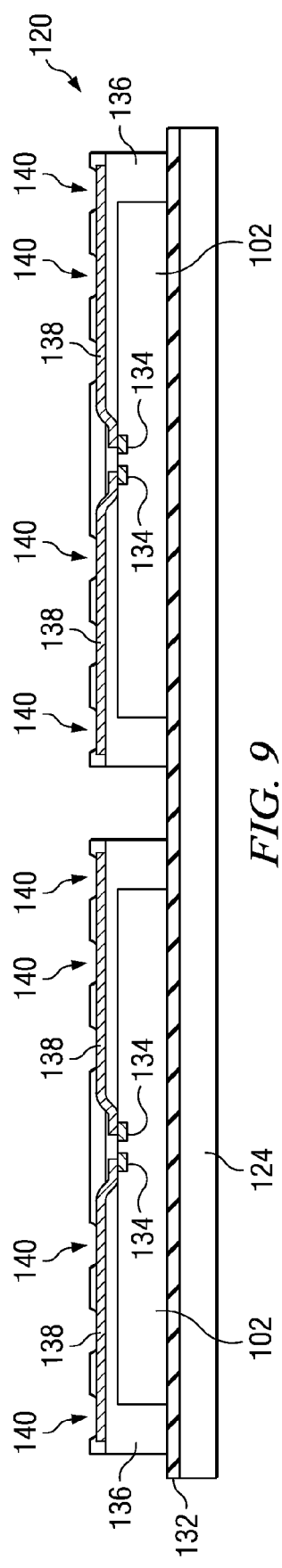

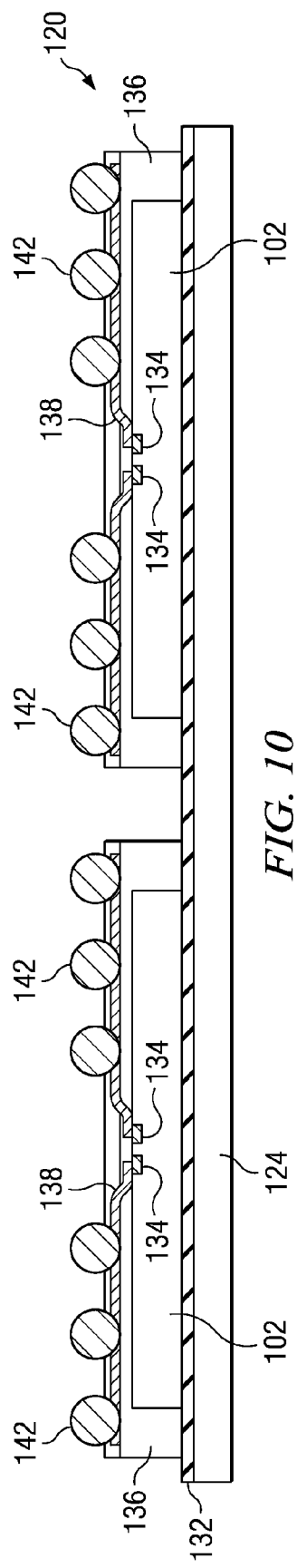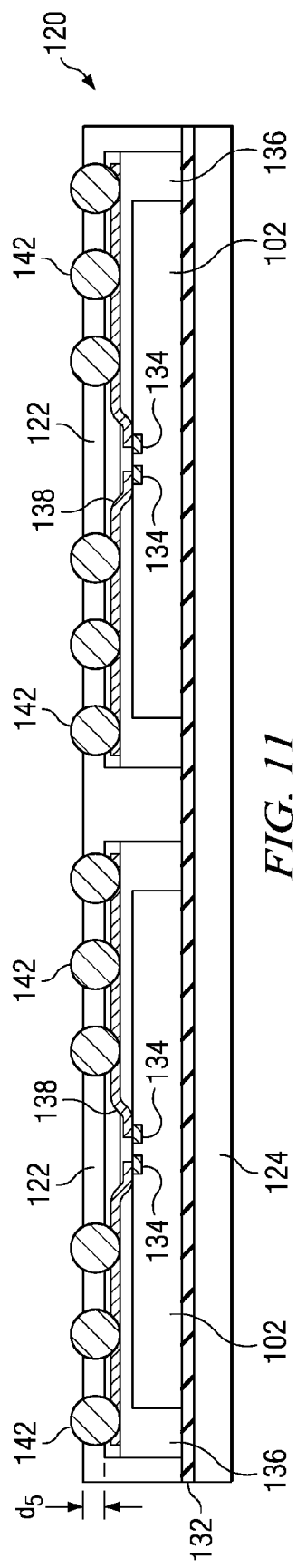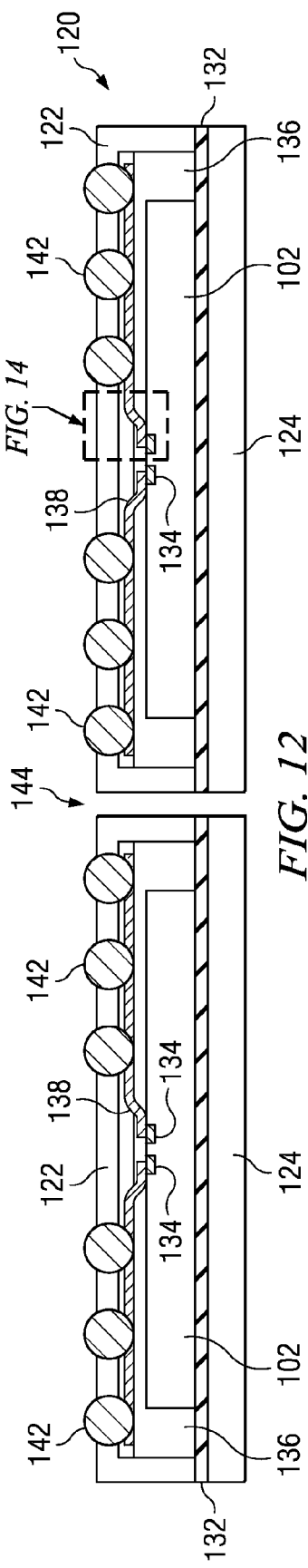

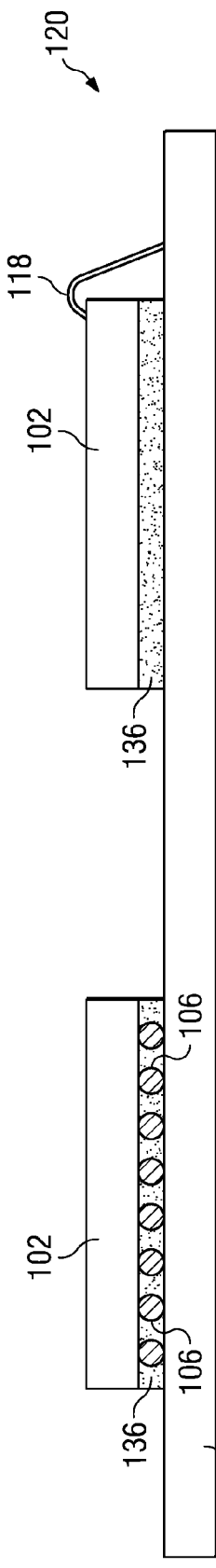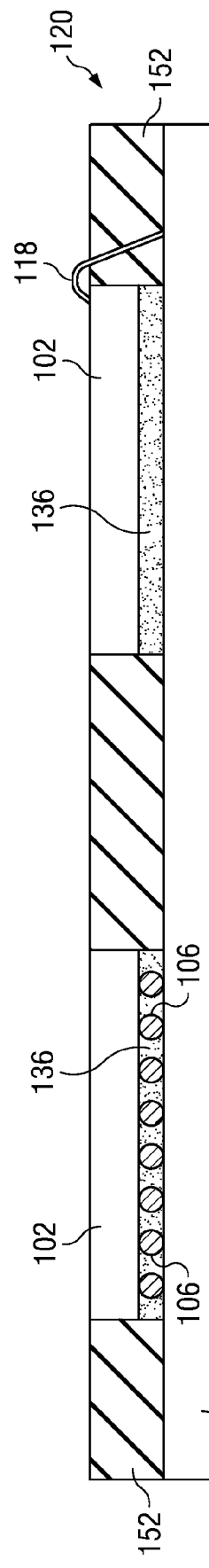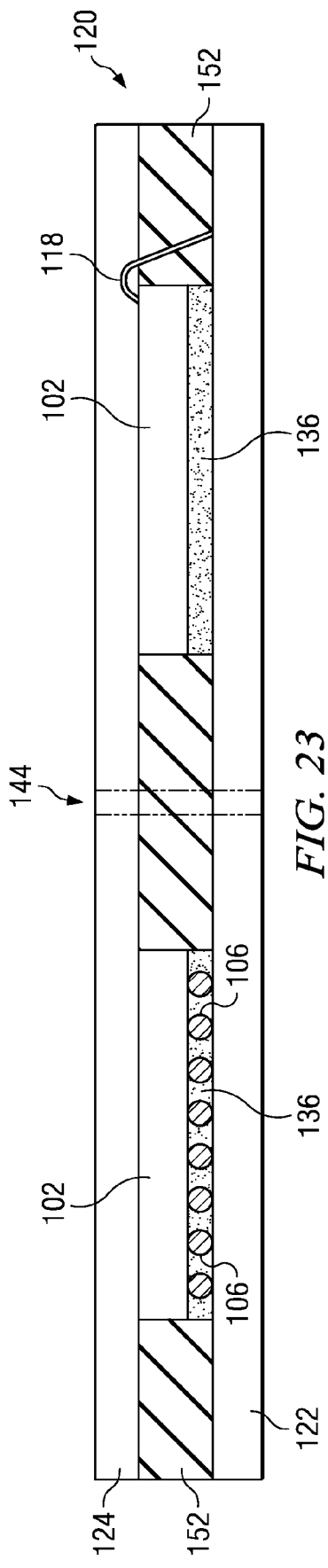

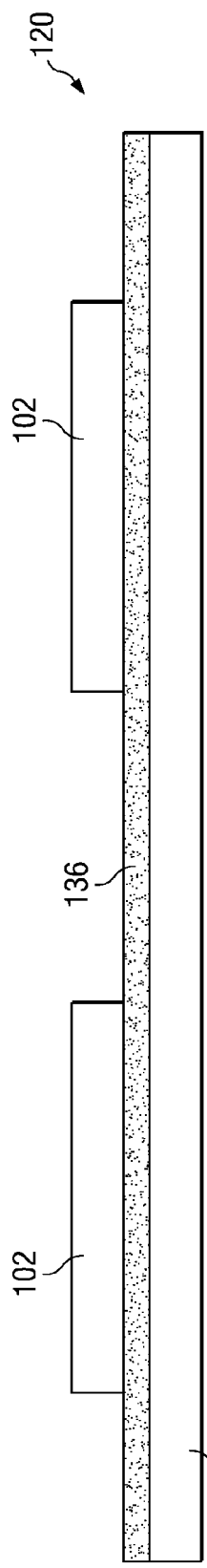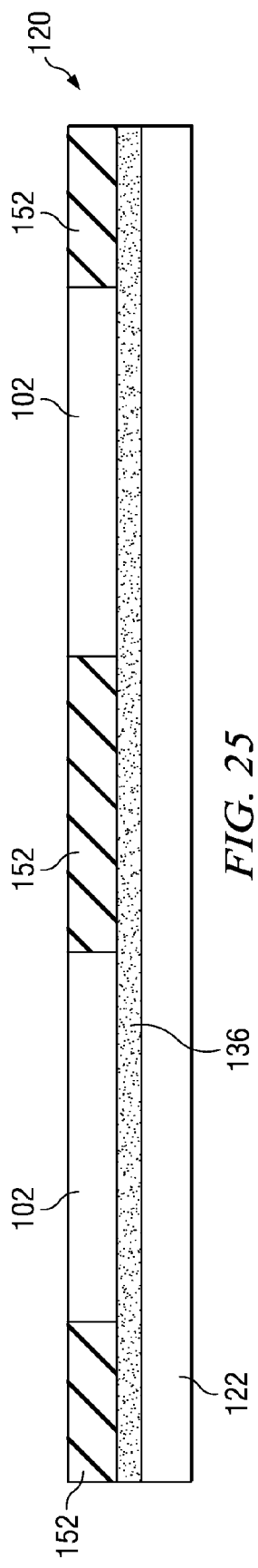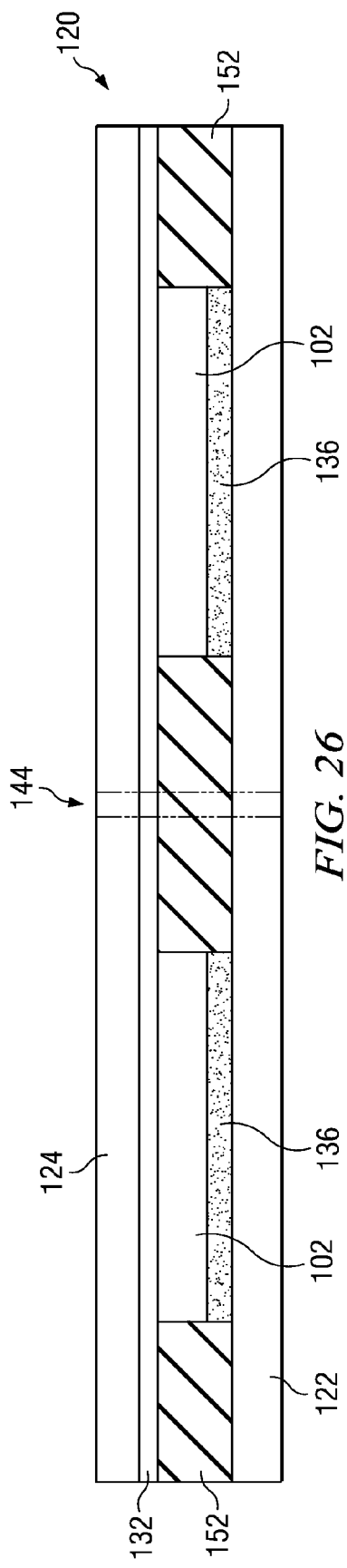

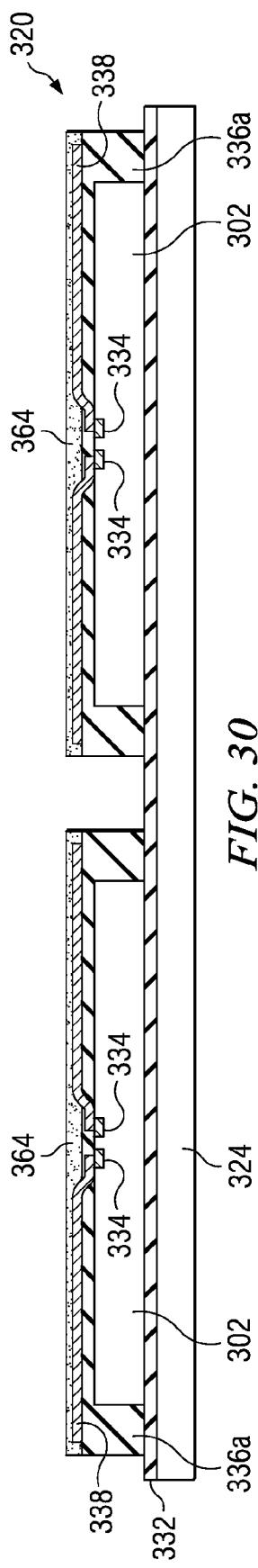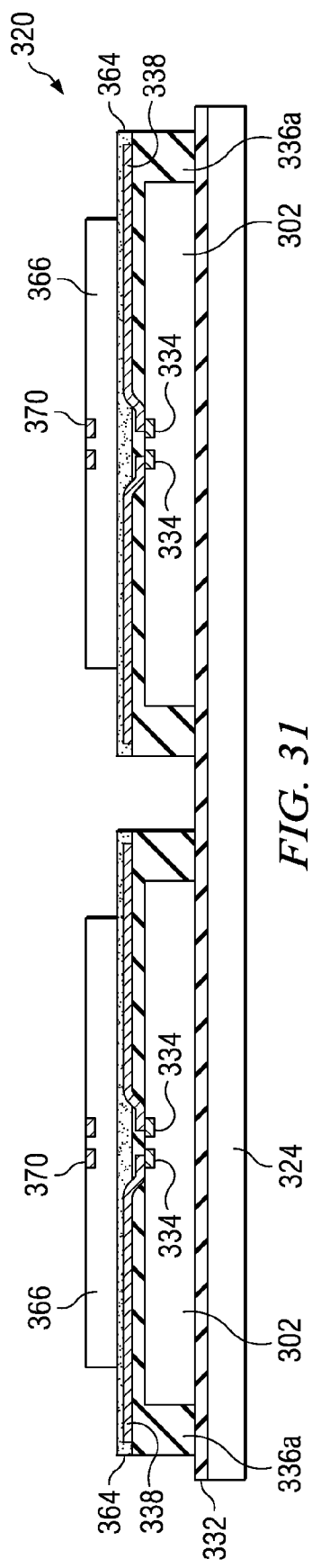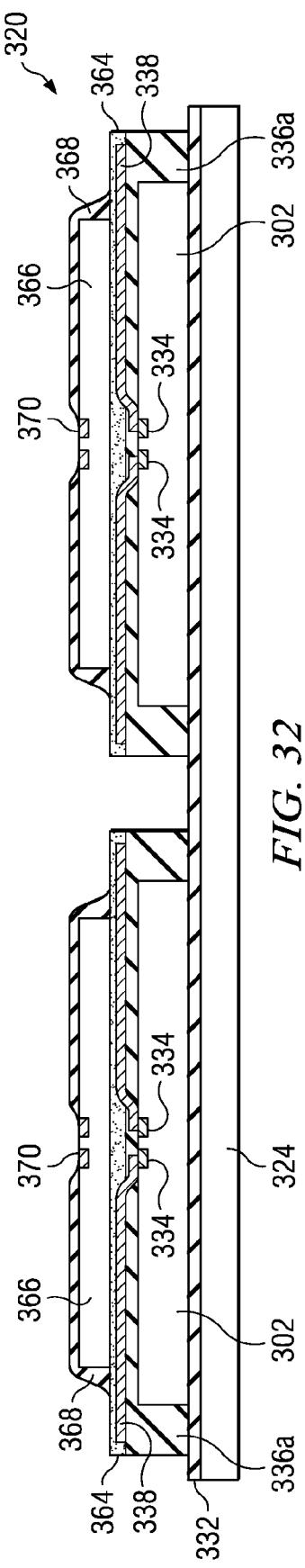

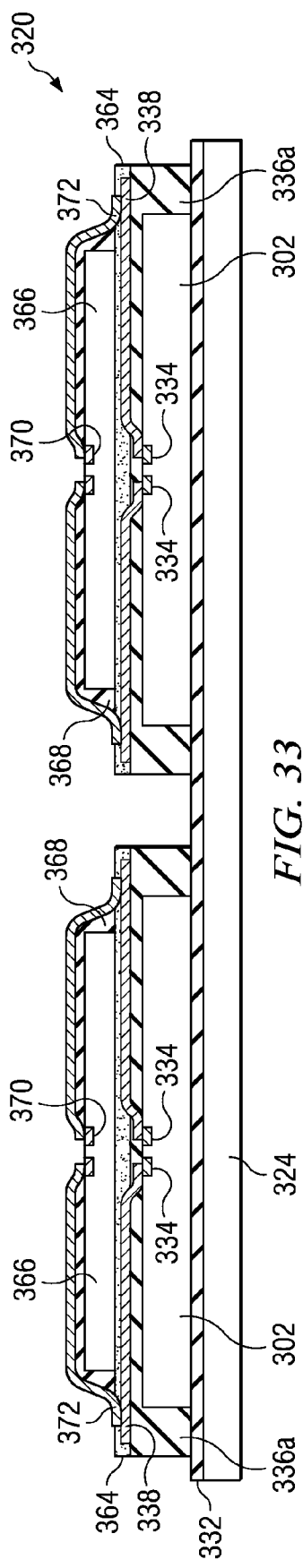
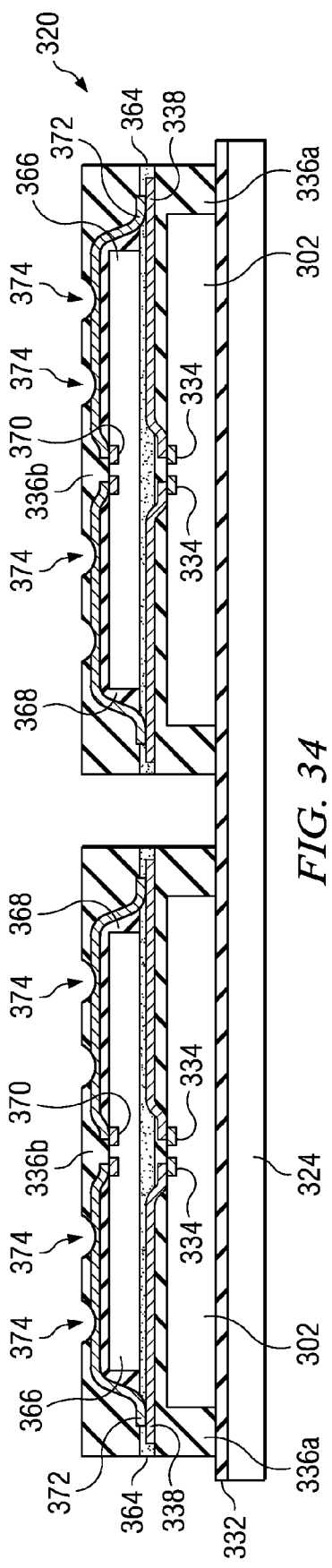

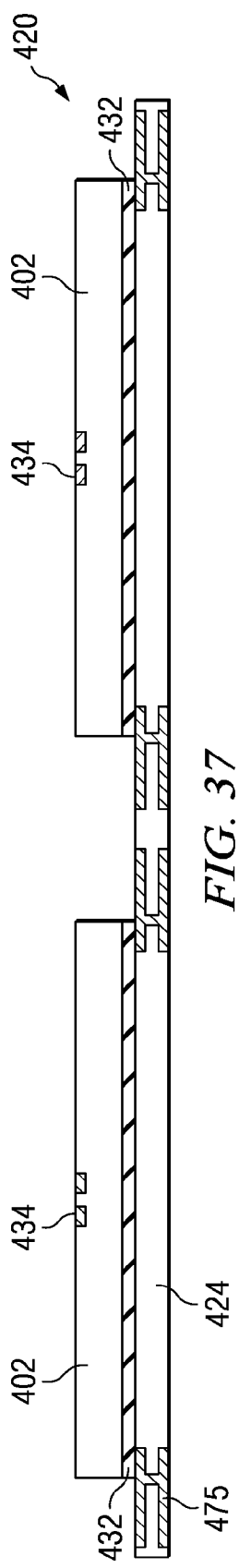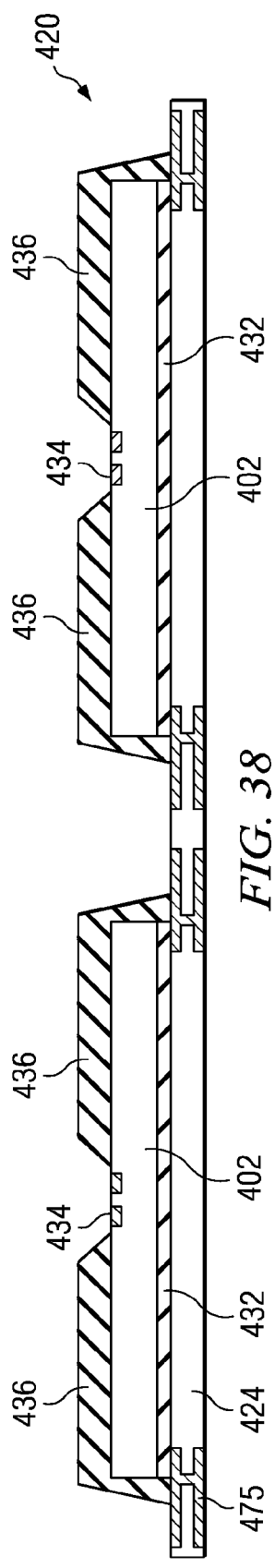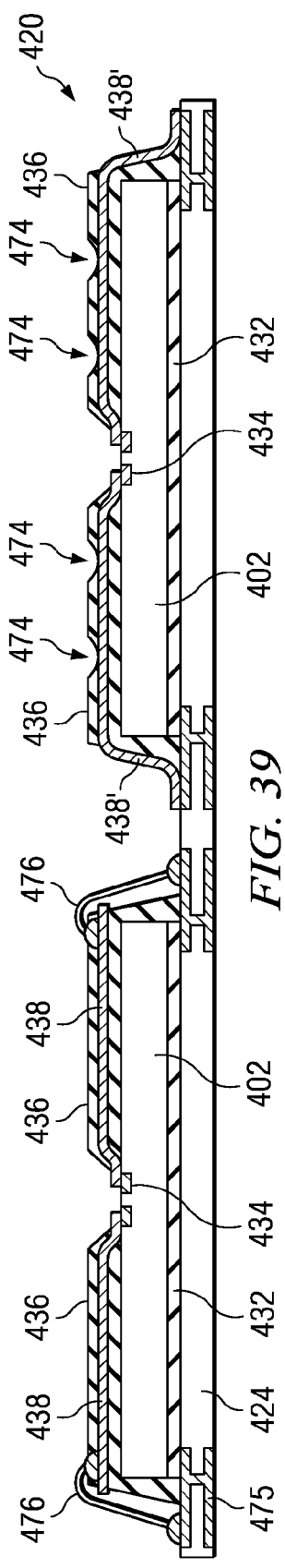

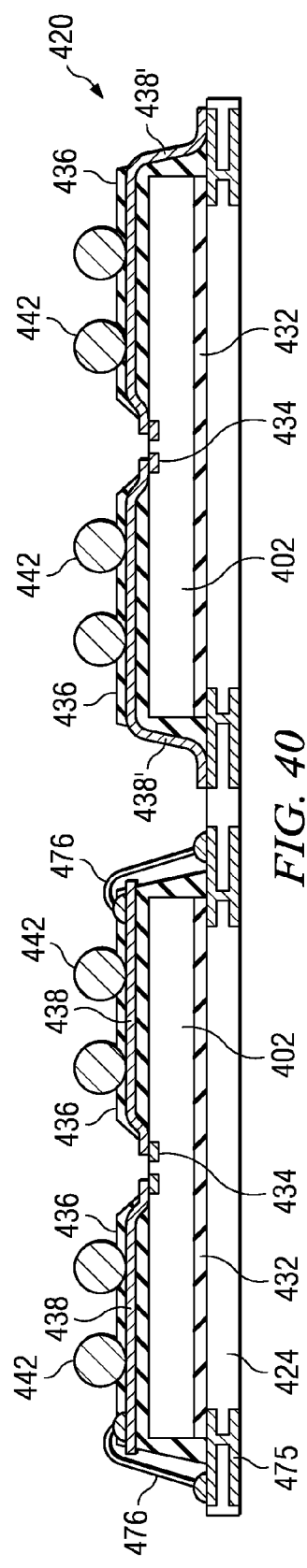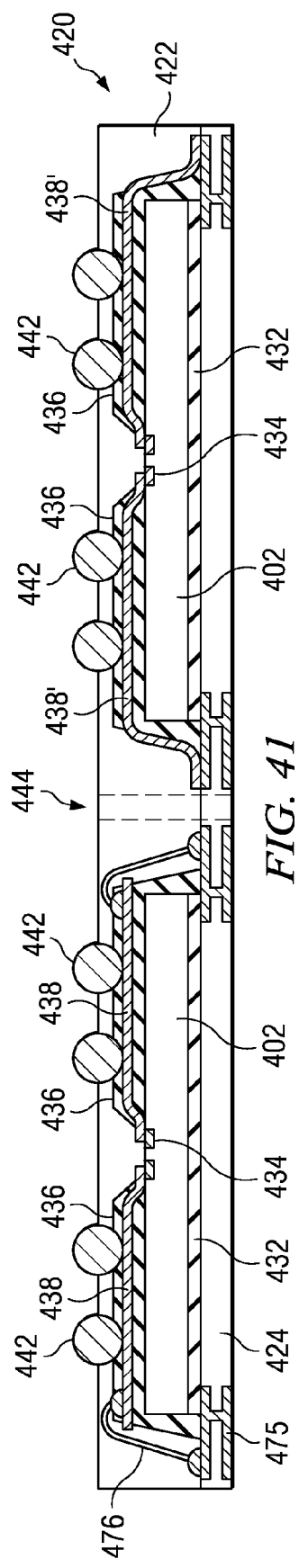

US 8,004,072 B2

PACKAGING SYSTEMS AND METHODS

TECHNICAL FIELD

The present invention relates generally to semiconductor devices, and more particularly to packaging systems and methods for integrated circuits.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Semiconductor devices are typically packaged as single die or in multi-chip modules. Many different types of packaging are used, and packaging techniques have changed throughout the years as semiconductor devices are scaled down in size and according to the end application that they are used in. Factors such as performance, size, weight, and operating conductions influence the type of packaging selected. In-line packages, small outline packages, quad surface mount, and array packages are examples of some major package families.

Array packages provide the ability to increase the lead count, reduce the footprint of the package, and reduce the length of interconnections between the die and the board. Array packages include pin grid array (PGA) packages, chip scale (CS) packages, and ball grid array (BGA) packages. BGA packages have an array of solder balls arranged across the bottom of the package. A die is mounted on top of a base and the die is electrically connected to the base using wire bonds or solder bumps. BGA packages are available that have several hundred, e.g., 300 or greater pin counts. Land grid array (LGA) packages are similar to BGA packages, without the solder balls.

However, the coefficient of thermal expansion is different for the various material layers in BGA, LGA, and other wafer level packages, which can lead to bowing and warping of the packages. The bowing and warping of the packages can cause cracking in the solder bonds, disconnects, and device failures.

Thus, what are needed in the art are improved packaging systems and methods for integrated circuits.

SUMMARY OF THE INVENTION

These and other problems are generally solved or circumvented, and technical advantages are generally achieved, by embodiments of the present invention, which provide novel packaging systems and methods.

In accordance with one embodiment of the present invention, a packaging system includes a first plate having a first coefficient of thermal expansion (CTE). An integrated circuit is mountable to the first plate. The packaging system includes a second plate coupleable over the first plate over the integrated circuit. The second plate has a second CTE that is substantially a same CTE as the first CTE. A plurality of solder balls is coupleable to the first plate or the second plate and to the integrated circuit.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 7 through 12 show cross-sectional views of a method of packaging an integrated circuit in accordance with an embodiment of the present invention at various stages;

FIGS. 21 through 26 show cross-sectional views of methods of packaging an integrated circuit in accordance with embodiments of the present invention at various stages;

FIGS. 30 through 36 show cross-sectional views of a three dimensional (3D) method of packaging multiple integrated circuits in accordance with an embodiment of the present invention at various stages; and FIGS. 37 through 42 show cross-sectional views of a package-to-package method of packaging multiple integrated circuits in accordance with another embodiment of the present invention.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Existing packaging techniques for semiconductor chips have a large amount of stress in the thermo-mechanical interconnection to a board level or substrate. Thermal changes lead to failures such as electrical or mechanical cracks inside the package or at the interface of the package to the board level. The thermal failures are caused by construction of the package. In most cases the design rules are restricted to a non-symmetrical build-up of package elements, which leads to bowing and warping of the package during temperature change. The non-symmetrical build-up of package elements also leads to a strong thermo-mechanical coupling between the chip and the substrate in a substrate-based package, or between the chip and the next level board, in a wafer level-based package. These construction features lead to reliability problems and failures in the end application.

Figure 1:
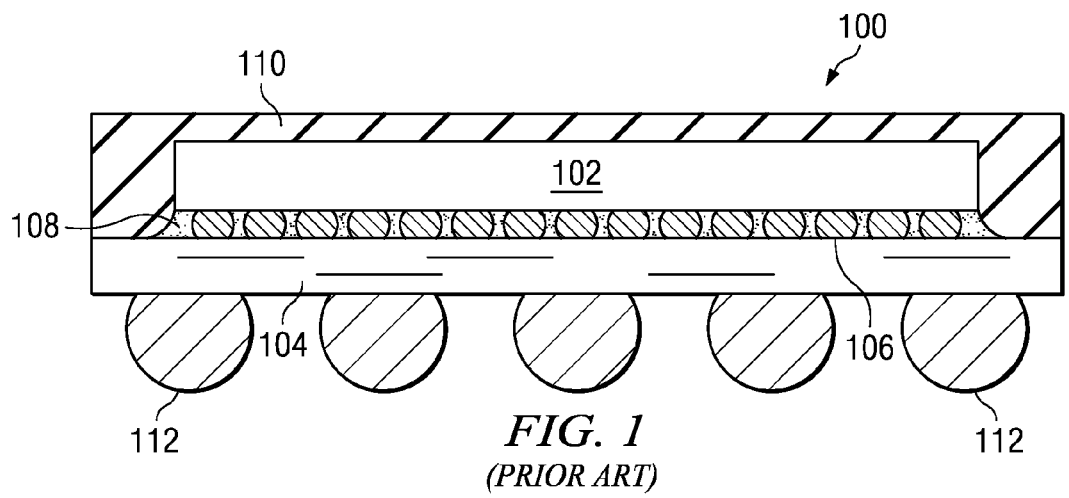
FIG. 1 shows a cross-sectional view of a prior art flip chip package.
Figure 2:
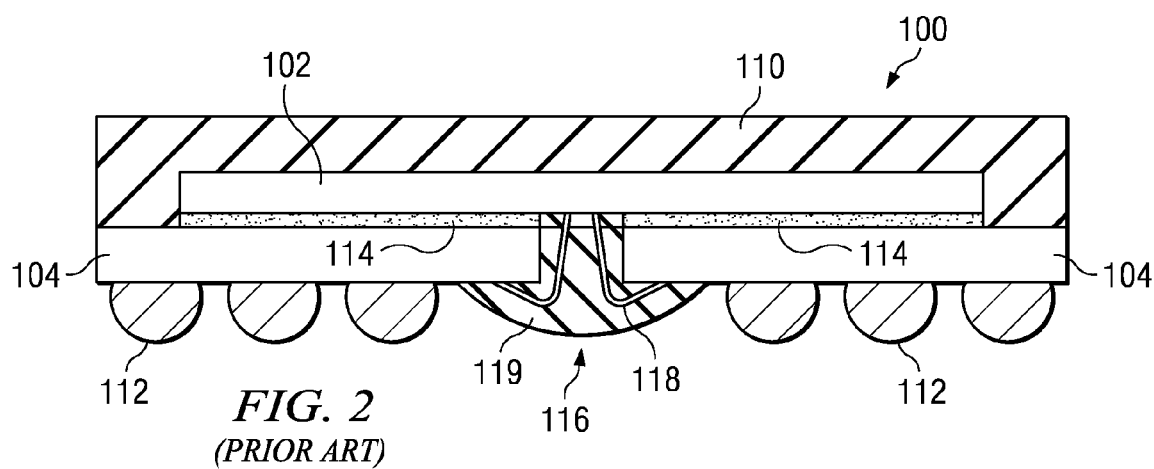
FIG. 2 shows a cross-sectional view of a prior art window BGA package.

FIGS. 1 and 2 show cross-sectional views of prior art packages for integrated circuits or chips 102. FIG. 1 shows a cross-sectional view of a prior art flip chip package 100. A chip 102 comprising an integrated circuit or die is attached to a substrate 104 by solder bumps 106 which are encapsulated in an underfill material 108. A mold compound cap 110 comprising a polymer is formed over the top and edges of the chip and substrate 104. Solder balls 112 are formed on the opposite side of the substrate 104.

A problem with flip chip packages 100 is that the CTE of the various vertically stacked components varies by a large amount. For example, the chip 102 may have a CTE of about 3 ppm/K, the mold compound cap 110 may have a CTE of about 8 to 12 ppm/K, the underfill material 108 may have a CTE of about 3 to 60 ppm/K, and the substrate 104 may have a CTE of about 16 ppm/K. Thus, the CTE of material on the top side of the chip 102 is lower than the CTE of the material on the bottom side of the chip 102, causing a CTE asymmetry of the vertical material stack of the package 100. Large solder balls 112 are required for electrical and mechanical connection to the next level board. The chip 102 is directly connected to the substrate 104 and has a strong CTE mismatch and force transfer. Furthermore, the package 102 is highly complex and has a very high cost.

FIG. 2 shows a cross-sectional view of a prior art window BGA package 100. The chip 102 is attached to the substrate 104 using an adhesive 114 that may have a CTE of about 30 to 60 ppm/K. The chip 102 is electrically connected to the substrate 104 by wire bonds 118 that are routed through a window 116 in the substrate 104 and that are covered by an encapsulation material 119. Other BGA packages may have wire bonds at edges of the chip 102 that electrically connect the chip 102 to the substrate 104, not shown. A similar CTE mismatch and asymmetry is seen in the window BGA package 100 as in the flip chip package 100 shown in FIG. 1: the mold compound cap 110 on the top side of the chip 102 has a lower CTE than the chip 102, yet the adhesive 114 and substrate 104 on the bottom side of the chip 102 have higher CTE's than the chip 102.

Figure 3:
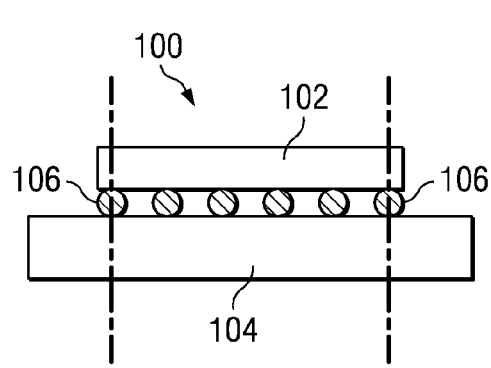
FIGS. 3 and 4 are cross-sectional views of prior art array packages that bow with changes in temperature.
Figure 4:
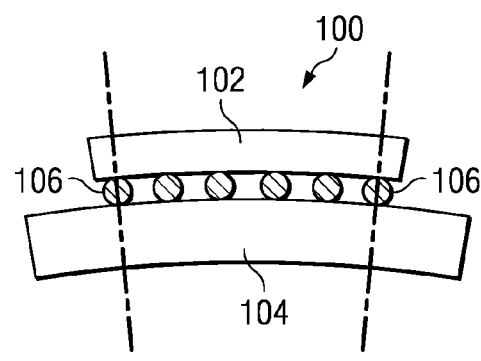

Flip chip packages, BGA packages, and other wafer level packages are most susceptible to CTE mismatch problems because the chip 102 is directly mounted to the substrate 104, which has a much different CTE than the chip 102. The package constructions are sensitive to warping due to the inhomogeneous and unbalanced inner construction. FIGS. 3 and 4 are cross-sectional views illustrating the bowing problems that occur in prior art array packages such as those shown in FIGS. 1 and 2, due to the CTE asymmetry of the vertical material stack. FIG. 3 shows a planar equilibrium state of the package 100 after a reflow soldering process at a high temperature. FIG. 4 shows a bowed stressed state of the package 100 after the temperature is lowered. The bow direction can also be opposite the direction shown in FIG. 4; e.g., depending on the materials in the stack, the center of the packaged chip 102 may bow downward rather than upward as shown in FIG. 4. For large chips 102, the direct connection of the chip 102 and the substrate 104 by hard solder balls, e.g., the solder bumps 106, causes increased stress at the interface at the solder bumps 106. At a certain level, e.g., at a distance from a neutral point larger than about 4 to 7 mm, the interface will be destroyed during temperature change, resulting in breaking or detachment of the solder bumps 106, causing device failures.

Furthermore, in the packages shown in FIGS. 1 and 2, the mold compound cap 110 is used as the chip 102 top coverage and also in the chip 102 fan-out region. For example, the mold compound cap 110 resides over the edges of the substrate 104 and extends outwardly beyond the chip 102. The mold compound cap 110 has a greater thickness at the edges of the substrate 104 in fan-out regions (where wiring from the pads on the chip 102 to the solder balls 112 is routed, not shown) than over the chip 102. This causes an additional CTE stack mismatch in a lateral direction across the packaged chip 102 and is another cause of bowing upon temperature fluctuations.

In addition, different chip 102 sizes result in different sized fan-out regions, resulting in different amounts of warping or bowing for different size chips 102, resulting in restricted reliability with respect to temperature changes. Changing the chip 102 size at a given package size leads to breakdown of the bowing behavior at different temperatures.

What are needed in the art are package designs for integrated circuits that are implementable with many different sized chips and allow a flexible use of chip to package ratio, without bowing or warping.

Embodiments of the present invention achieve technical advantages by providing novel packaging systems with material layers that have a symmetric CTE in a vertical stack in the package. The matched CTEs provide thermally balanced packages that do not bow or warp with temperature changes. The packaging systems are novel array packages that may have embedded solder balls in some embodiments. The packaging systems comprise stress adapted and compensated array packages that may be implemented in BGA, LGA, or other types of contact schemes.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 5:
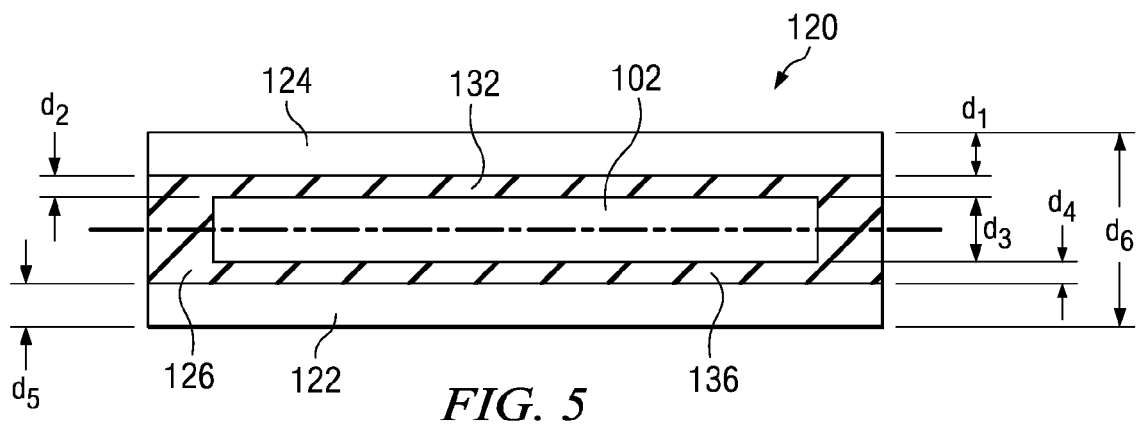
FIG. 5 is a cross-sectional view illustrating a principle of a packaging system in accordance with an embodiment of the present invention.

FIG. 5 is a cross-sectional view illustrating a principle of a packaging system 120 in accordance with an embodiment of the present invention. The packaging system 120 is also referred to herein as a semiconductor device or a packaged integrated circuit. The packaging system 120 comprises a plurality of vertically stacked, thermally balanced, symmetric material layers that are disposed or formed around an integrated circuit, chip, or die 102.

The packaging system 120 includes a bottom cover 122 comprising a plate and a top cover 124 comprising a plate having substantially the same CTE as the bottom cover 122. The bottom cover 122 is also referred to herein as a first plate 122 or a front plane, and the top cover 124 is also referred to herein as a second plate 124 or back plane. Note that the bottom cover 122 and top cover 124 may alternatively be referred to herein as a second plate 122 and a first plate 124, depending on the orientation of the packaged integrated circuit 120 in the drawings and depending on the order of the manufacturing process flow.

The bottom cover 122 comprises a substrate in some embodiments and may comprise a polymer front plane. The bottom cover 122 may comprise a silicon-enriched mold compound, for example. The bottom cover 122 does not contain a redistribution layer (RDL) as some substrates for packages do, in some embodiments. The top cover 124 may comprise a polymer or metal back plane, and may comprise copper or copper foil in some embodiments. The top cover 124 may comprise copper, a copper alloy, copper foil, resin copper-copper (RCC) foil, or other lead-frame type of material, to improve heat spreading and dissipation, for example. The covers 122 and 124 may comprise a semiconductor substrate or a printed circuit board (PCB) substrate, for example.

The covers 122 and 124 may comprise the same material in some embodiments, for example. The covers 122 and 124 or plates may comprise substantially the same Young's modulus in other embodiments, as another example. In yet other embodiments, the covers 122 and 124 may comprise the same thickness. The covers 122 and 124 may comprise a CTE that is substantially the same as a board or substrate that the packaged integrated circuit 120 will be attached to in some embodiments, in order to adapt the packaging system 120 outer cover 122/124 or shell CTE to the CTE of the board or substrate in the end application that the packaged integrated circuit 120 is used in.

If the CTE of the bottom cover 122 comprise about 16 ppm/K, a material for the top cover 124 may be selected that has a CTE that is substantially the same, e.g., about 16 ppm/K. Alternatively, the CTE of the covers 122 and 124 may comprise other values. Matching the CTE's of the covers 122 and 124 comprises one portion of the CTE adaptation in accordance with embodiments of the present invention.

A second portion of CTE adaptation in accordance with embodiments of the present invention comprises using an inner fill material 126 as a buffer between the CTE mismatch between the covers 122 and 124 and the integrated circuit 102, which may have a CTE of about 3 ppm/K. The inner fill material 126 includes a buffer layer 132 disposed between the top cover 124 and the integrated circuit 102. The top cover 124 may be connected conductively through the top buffer layer 132 by a conductive path that may comprise areas of thermally conductive glue, for example, not shown. The inner fill material 126 also includes a buffer layer 136 disposed between the bottom cover 122 and the integrated circuit 102. Buffer layer 136 is also referred to herein as a first buffer layer 136, and buffer layer 132 is also referred to herein as a second buffer layer 132. The first buffer layer 136 and the second buffer layer 132 may comprise a soft elastic polymer, although alternatively, the buffer layers 132 and 136 may comprise other materials. The buffer layers 132 and 136 may comprise an adhesive, tape, silicone, polyimide, Elastosil™ by Wacker Chemie AG, epoxy, other soft materials having a low Young's modulus, or a combination thereof in some embodiments, for example. The buffer layers 136 and 132 buffer or decouple the CTE mismatch between the integrated circuit 102 and the covers 122 and 124.

The top cover 124 may comprise a thickness of dimension $d_1$, wherein dimension $d_1$ comprises about 70 to 200 μm in some embodiments, for example. The second buffer layer 132 may comprise a thickness of dimension $d_2$, wherein dimension $d_2$ comprises about 50 to 100 μm in some embodiments. The integrated circuit 102 may comprise a thickness of dimension $d_3$, wherein dimension $d_3$ comprises about 50 to 200 μm, for example. The first buffer layer 136 may comprise a thickness of dimension $d_4$, wherein dimension $d_4$ comprises about 50 to 100 μm in some embodiments. The second buffer layer 132 may comprise the same thickness as the first buffer layer 136, for example. The bottom cover 122 may comprise a thickness of dimension $d_5$, wherein dimension $d_5$ comprises about 70 to 200 μm in some embodiments. The top cover 124 may comprise the same thickness as the bottom cover 122, for example. The total thickness of the packaged integrated circuit or semiconductor device 120 may comprise a thickness of dimension $d_6$, wherein dimension $d_6$ comprises about 300 to 800 μm in some embodiments. Alternatively, dimensions $d_1$, $d_2$, $d_3$, $d_4$, $d_5$, and $d_6$ and may comprise other values.

Figure 6:
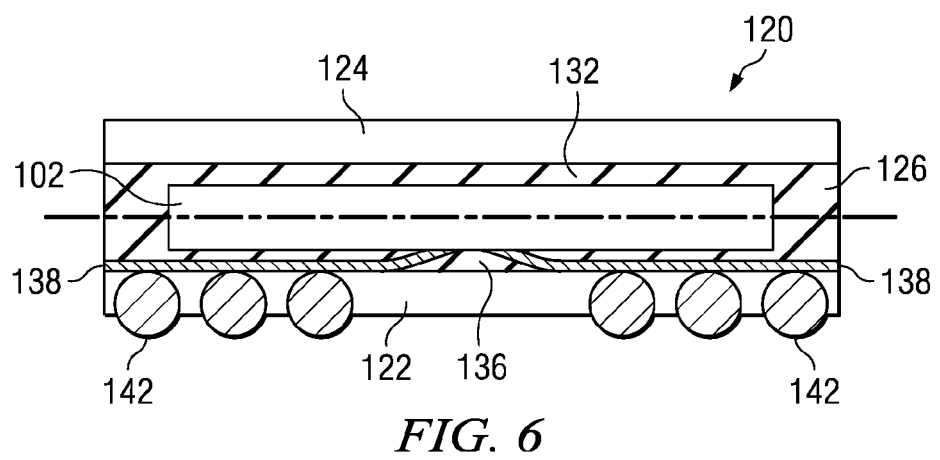
FIG. 6 shows a more detailed cross-sectional view of a packaging system in accordance with an embodiment of the present invention.

FIG. 6 shows a more detailed cross-sectional view of the embodiment of the present invention shown in FIG. 5. Thin film wiring 138 is formed over the bottom cover 122 and is coupled to bond pads of the integrated circuit 102. The thin film wiring 138 may function as a redistribution layer of the packaging system 120, for example. The thin film wiring 138 redistributes the pad arrangement of the integrated circuit 102 to the solder ball 142 level arrangement. The thin film wiring 138 may be formed using deposition, lithography, etch, and plating processes, for example. The thin film wiring 138 allows a buffer extension and a simple fan-out solder ball 142 formation. The thin film wiring 138 may comprise multi-layer wiring that includes power, ground, and/or shielding, as examples.

A plurality of solder balls 142 is shown partially embedded in the bottom cover 122. The plurality of solder balls 142 is coupled to the thin film wiring 138. The solder balls 142 may be embedded in the bottom cover 122 by about 30% or greater in some embodiments, for example. In other embodiments, the solder balls 142 may not be embedded, but rather, may be disposed on the surface of the bottom cover 122, for example, not shown.

Because the packaged integrated circuit 120 includes hard shell covers 122 and 124 comprising a matched CTE, with flexible buffer layers 132 and 136 disposed between the covers 122 and 124 and the integrated circuit 102, warping of the packaged integrated circuit 120 is prevented. When the solder balls 142 are formed on the packaged integrated circuit 120 or other temperature fluctuations are introduced, shear stress is not introduced, preventing bowing and warping, and improving reliability.

After the integrated circuit 102 is packaged, the packaged integrated circuit 120 is later attached to a PCB or other type of application. In some embodiments, the CTE of the covers 122 and 124 is selected to match the PCB of the end application, so that the CTE of the packaged integrated circuit 120 matches the CTE of the PCB and there is no shear stress between the PCB and the packaged integrated circuit 120. Because in some embodiments, the solder balls 142 are partially embedded in the bottom cover 122, the solder balls 142 may vary in-plane the same as the next level board or PCB of the end application during temperature fluctuations, for example.

In some embodiments, during the processing of the packaging system 120, high temperature processes are not used on the packaging system 120 before forming the thin film wiring 138, in order to prevent panel warping for the wiring processes. Processes are also not used that may lead to die shift during embedding, to maintain pick and place accuracy, which may be necessary for a highly precise redistribution wiring overlap to the integrated circuit 102 bond pads, for example.

FIGS. 7 through 12 show cross-sectional views of a method of packaging an integrated circuit 102 in accordance with an embodiment of the present invention. Like numerals are used for the various elements that were used to describe FIGS. 5 and 6, and to avoid repetition, each reference number shown in FIGS. 7 through 12 is not described again in detail herein. The views shown in FIGS. 7 through 12 are inverted or upside-down relative to the packaged integrated circuit 120 shown in FIG. 6.

Referring to FIG. 7, a top plate 124 material is provided, and the top buffer 132 material is formed over the top plate 124 material. Integrated circuits 102 are mounted on the top plate 124 material over the top buffer 132 material. The top plate 124 may comprise a 300 mm thick pre-molded back-end wafer or gold wafer in some embodiments, as examples. Alternatively, the top plate 124 may comprise other materials, as described previously herein. The top buffer layer 132 comprising an adhesive or tape is attached or printed to the top plate 124 material, and the integrated circuits 102 may be attached to the buffer layer 132 using a pick and place machine, for example.

A front side buffer layer 136 is applied over the integrated circuits 102, as shown in FIG. 8. The front side buffer layer 136 may comprise a polymer that is printed onto the top plate 124 material over the integrated circuits 102, for example, embedding the integrated circuits 102 in the soft polymer material or buffer layer 136, for example. The buffer layer 136 material 136 may be deposited over the integrated circuits 102 to completely cover the top plate 124 material, and the buffer layer 136 material may be patterned using lithography to leave the buffer layer 136 over the integrated circuits 102. Portions of the buffer layer 136 are removed from over the bond pads 134 of the integrated circuits 102, as shown.

Thin film wiring 138 is formed over the top side buffer layer 136, as shown in FIG. 9. The thin film wiring 138 may be formed using a sputter process, plating process, lithography process, and a solder stop print process, exposing portions 140 of the thin film wiring 138 where solder balls will be formed. Alternatively, the thin film wiring 138 may also be formed using an electroless metallization process, for example. Solder balls 142 are then applied on the exposed thin film wiring 138, by transferring the solder balls 142 and performing a reflow process, as shown in FIG. 10.

The bottom plate 122 is then formed over the structure, as shown in FIG. 11. The bottom plate 122 may be formed using back-end wafer molding, e.g., using a soft cover-on-wall tooling to generate exposed solder balls 142. The bottom plate 122 material may comprise the same material as the front plate 124 material in some embodiments, for example. A dicing process is then used to singulate the die along the scribe lines 144 and form individually packaged integrated circuits 102, as shown in FIG. 12.

Figure 13:
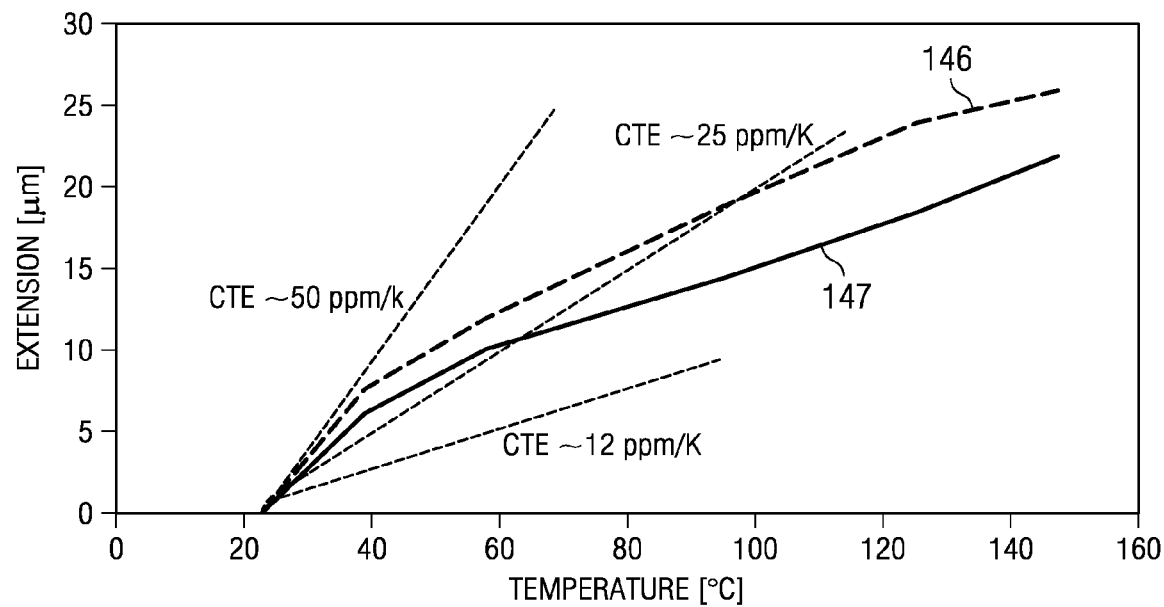
FIG. 13 is a graph illustrating experimental CTE adaptation in accordance with an embodiment of the present invention.

FIG. 13 is a graph illustrating experimental CTE adaptation in accordance with an embodiment of the present invention, wherein copper is used as a top plate 124. In-plane CTE measurements of copper wiring on top of a silicone buffer layer are shown. The graph shows temperature in degrees C on the x axis and the extension on the y axis. The amount by which copper extends in-plane, when used as a top plate 124 for a 20×20 mm package, with a 100 μm silicon filler material comprising Elastosil™ deposited on a silicon wafer. Two measurements of copper extension are shown at 146 and 147. The copper plate 124 was formed by sputtering on about 50 nm of Ti and 150 nm of Cu, followed by a Cu plating of about 9 μm. The graphs for CTE's of 12 ppm/K, 25 ppm/K, and 50 ppm/K are shown for comparison. Under these conditions, a copper plate 124 was found to extend with about 16 to 18 ppm/K, as calculated. Thus, when a copper top plate 124 is heated, the CTE of the copper plate 124 remains in the range of about 16 ppm/K, which provides a CTE match for bottom plate 122 comprising a substrate that has a CTE of about 16 ppm/K, for example.

Figure 14:
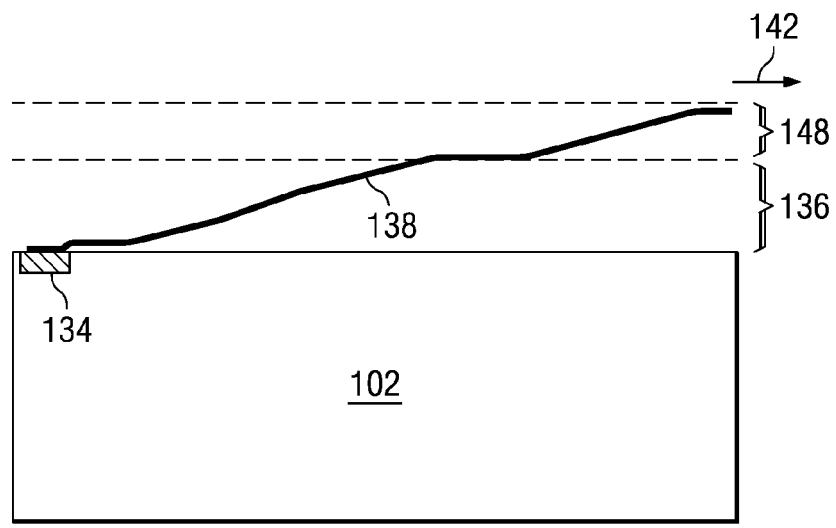
FIG. 14 shows a more detailed cross-sectional view of the wiring portion from a pad on an integrated circuit to a solder ball of the packaging system shown FIG. 12.

FIG. 14 shows a more detailed cross-sectional view of the wiring portion from a pad 134 on the integrated circuit 102 to a solder ball 142 of the packaging system 120 shown FIG. 12. The more detailed view of FIG. 14 illustrates that the thin film wiring 138 is formed on a sloped buffer layer 136 over the integrated circuit 102. The integrated circuit 102 comprises silicon which may have a hardness of about 180 GPa, for example. The buffer layer 136 comprises a first layer of polyimide and an Elastosil™ material disposed over the polyimide, which may have a hardness of about 10 MPa. The plate 122 may have a lower layer of epoxy 148 proximate the solder balls 142. Simulation results show that an angular formed buffer layer 136 may be used for the thin film wiring 138 connections with highly reliable thermo-mechanical conditions.

Figure 15:
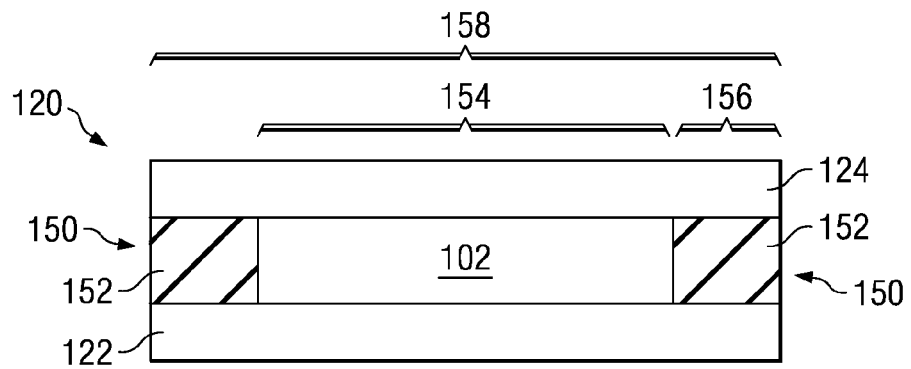
FIG. 15 shows a cross-sectional view of a packaging system in accordance with another embodiment of the present invention.

FIG. 15 shows a cross-sectional view of a packaging system 120 in accordance with another embodiment of the present invention. In this embodiment, lateral CTE mismatches are compensated for across the horizontal surface of the packaged integrated circuit 120, preventing bowing and warping of the overall packaging system 120 by using a fill material 152 to fill in the gap between the plates 122 and 124 at the fan-out regions 150. The CTE of the top and bottom plate 122 and 124 are also matched by the material selection and material properties of the plates 122 and 124, as described for the previous embodiments. The CTE of optional buffer layers, not shown, may also be matched as described for the previous embodiments.

The integrated circuit 102 is smaller in a lateral direction than the first plate 122. The integrated circuit 102 is disposed over a central region 154 of the first plate 122. The packaged integrated circuit 120 comprises a fan-out region 150 at the edge regions 156. A filler material comprising a gap fill material 152 is disposed between the plates 122 and 124 in the edge regions 156. The fan-out region 150 includes a material stack that comprises the first plate 122, the gap fill material 152, and the second plate 124. The central region 154 includes a material stack that comprises the first plate 122, the integrated circuit 102 and any adhesives or buffer materials 132 or 136 (not shown in FIG. 15), and the second plate 124. The material for the gap fill material 152 is selected to comprise material properties to compensate for warping or bowing of the overall packaged integrated circuit 120 in accordance with some embodiments of the present invention. The gap fill material 152 may comprise a polymer or a liquid mold compound, for example, although alternatively, other materials may be used for the gap fill material 152. The gap fill material 152 may comprise a liquid mold compound such as a Henkel QMI series, Hitachi CEL series, or ShinEtsu Semicoat material, as examples.

The filler material comprises a gap fill material 152 that is adapted to compensate in the fan-out region 150 for a tendency to bow upon temperature fluctuation of the material stack comprising at least the first plate 122, the integrated circuit 102, and the second plate 124. The gap fill material 152 may substantially eliminate a tendency to bow of the overall packaged integrated circuit upon temperature fluctuation, in some embodiments.

FIGS. 16 through 20 are graphs that illustrate the affect of material properties of the material stacks in the central region 154 and the edge regions 156 on the overall packaged integrated circuit 120, e.g., over the entire lateral width of the package, as shown at FIG. 15 at 158. The graphs in FIGS. 16 through 20 illustrate results of an extended Stoney equation, which describes the bow of layered systems, over a temperature change or ΔT of −140 degrees C. The calculations were extended to include laterally inhomogeneous system structures.

Figure 16:
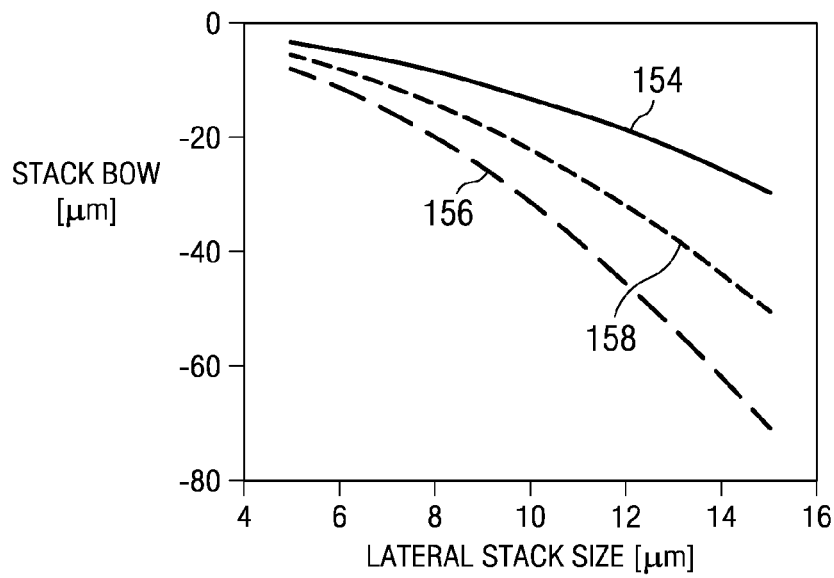
FIG. 16 is a graph illustrating bowing that can occur as a result of CTE mismatch.

FIG. 16 is a graph illustrating bowing that can occur as a result of CTE mismatch of the material stacks laterally across a package. Table 1 shows the material properties of the materials in the stacks that were used in the simulation to generate the graphs shown in FIG. 16.

TABLE 1

| | Young's Modulus (GPa) | Poisson Number | CTE (ppm/K) | Thickness (μm) |
|---|---|---|---|---|
| Second plate 124 | 50 | | 10 | 200 |
| Integrated circuit 102 | 150 | 0, 17 | 3 | 150 |
| Buffer layers 132/136 | 1 | | 58 | 20 |
| First plate 122 | 20 | 0, 3 | 16 | 200 |
| Gap fill material 152 | 5 | | 66 | 170 |

Graph 154 in FIG. 16 shows the amount of stack bow for a range of lateral stack sizes in the central region 154 of FIG. 15 that includes the integrated circuit 102. Graph 156 in FIG. 16 shows the amount of stack bow for a range of lateral stack sizes in the edge regions 156 of FIG. 15 that includes the gap fill material 152. Graph 158 in FIG. 16 shows the amount of bow for the overall packaged integrated circuit 120 shown in FIG. 15 as a result of the bow of the material stacks in regions 154 and 156. The amount of bow 158 for the overall packaged integrated circuit 120 falls between the calculated bow for the central region 156 and the edge regions 156. The simulation results in the graphs of FIG. 16 show that the larger the lateral size of the package is, the larger the bowing problem will be. Thus, the package having the materials properties shown in Table 1 will have reliability problems, because the package bowing with temperature is dependent on the fan-out length.

Figure 17:
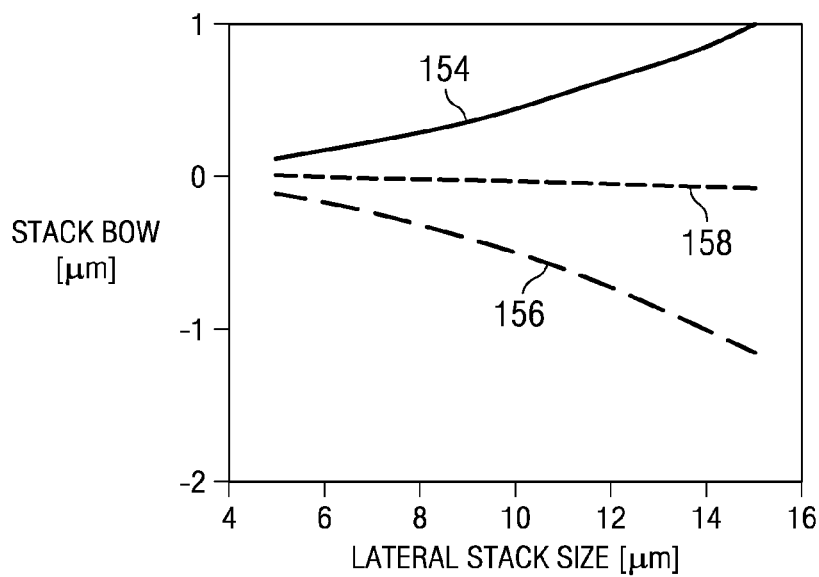
FIG. 17 is a graph showing that package bowing may be prevented using a balanced packaging system of an embodiment of the present invention.

FIG. 17 is a graph showing that package bowing may be prevented using a balanced packaging system 120 in accordance with an embodiment of the present invention. Table 2 shows the material properties of the materials in the stacks that were used in the simulation to generate the graphs shown in FIG. 17.

TABLE 2

| | Young's Modulus (GPa) | Poisson Number | CTE (ppm/K) | Thickness (μm) |
|---|---|---|---|---|
| Second plate 124 | 20 | 0, 3 | 16 | 217 |
| Integrated circuit 102 | 150 | 0, 17 | 3 | 150 |
| Buffer layers 132/136 | 1 | | 60 | 20 |
| First plate 122 | 20 | 0, 3 | 16 | 200 |
| Gap fill material 152 | 0 . . . 10 | | 10 . . . 200 | 170 |

The central region 154 comprises a balanced stack, having the same CTE and Young's modulus for the plates 122 and 124, and having substantially the same thickness for the plates 122 and 124. The simulation results show that for a balanced central region 154 stack, the central region 154 stack will not bow for any fan-out or edge region 156. The edge region 156 will not bow and is nearly independent of the modulus and CTE. The resultant package, shown in graph 158, will not bow and is independent of the lateral size.

Figure 18:
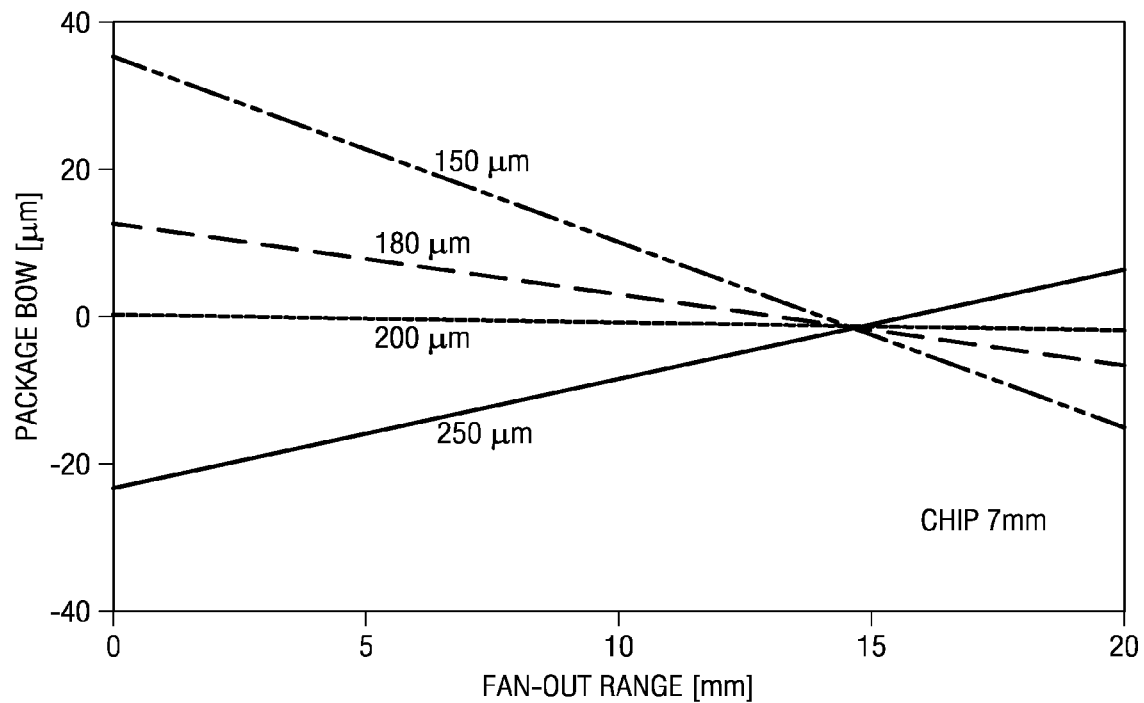
FIG. 18 is a graph showing package bow over a fan-out range of a balanced packaging system in accordance with an embodiment of the present invention.

FIG. 18 is a graph showing package bow over a fan-out range in accordance with a balanced package in accordance with an embodiment of the present invention. Table 3 shows the material properties of the materials in the stacks that were used in the simulation to generate the graphs shown in FIG. 18.

TABLE 3

| | Young's Modulus (GPa) | Poisson Number | CTE (ppm/K) | Thickness (μm) |
|---|---|---|---|---|
| Second plate 124 | 20 | 0, 3 | 16 | 217 |
| Integrated circuit 102 | 150 | 0, 17 | 3 | 150 |
| Buffer layers 132/136 | 1 | | 60 | 20 |
| First plate 122 | 20 | 0, 3 | 16 | 200 |
| Gap fill material 152 | 1 | | 70 | 170 |

The simulation calculations in FIG. 18 were calculated for a 7 mm integrated circuit or chip 102 having a range of thicknesses for the first plate 122 or substrate; 150 μm, 180 μm, 200 μm, and 250 μm. For a first plate 122 or substrate having a thickness of 200 μm of a balanced package, there was substantially no bowing of the package. The range of the fan-out region 150 was open, and the gap fill material 152 was in an open large range.

Figure 19:
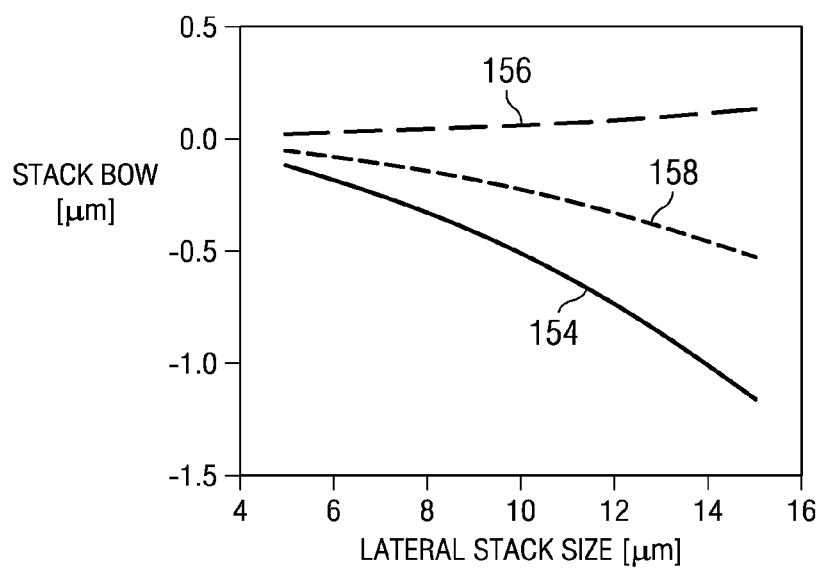
FIG. 19 is a graph showing package bow resulting from a top plate comprising a polymer.

FIG. 19 is a graph showing package bow resulting from a top plate 124 comprising a polymer. Table 4 shows the material properties of the materials in the stacks that were used in the simulation to generate the graphs shown in FIG. 19. Using a polymer as a top plate 124 or cover may contribute an additional amount of stress due to material shrinkage, which influences the amount of bowing.

TABLE 4

| | Young's Modulus (GPa) | Poisson Number | CTE (ppm/K) | Thickness (μm) |
|---|---|---|---|---|
| Second plate 124 | 50 | | 13 | 217 |
| Integrated circuit 102 | 150 | 0, 17 | 3 | 150 |
| Buffer layers 132/136 | 1 | | 60 | 20 |
| First plate 122 | 20 | 0, 3 | 16 | 230 |
| Gap fill material 152 | 1 | | 70 | 170 |

Figure 20:
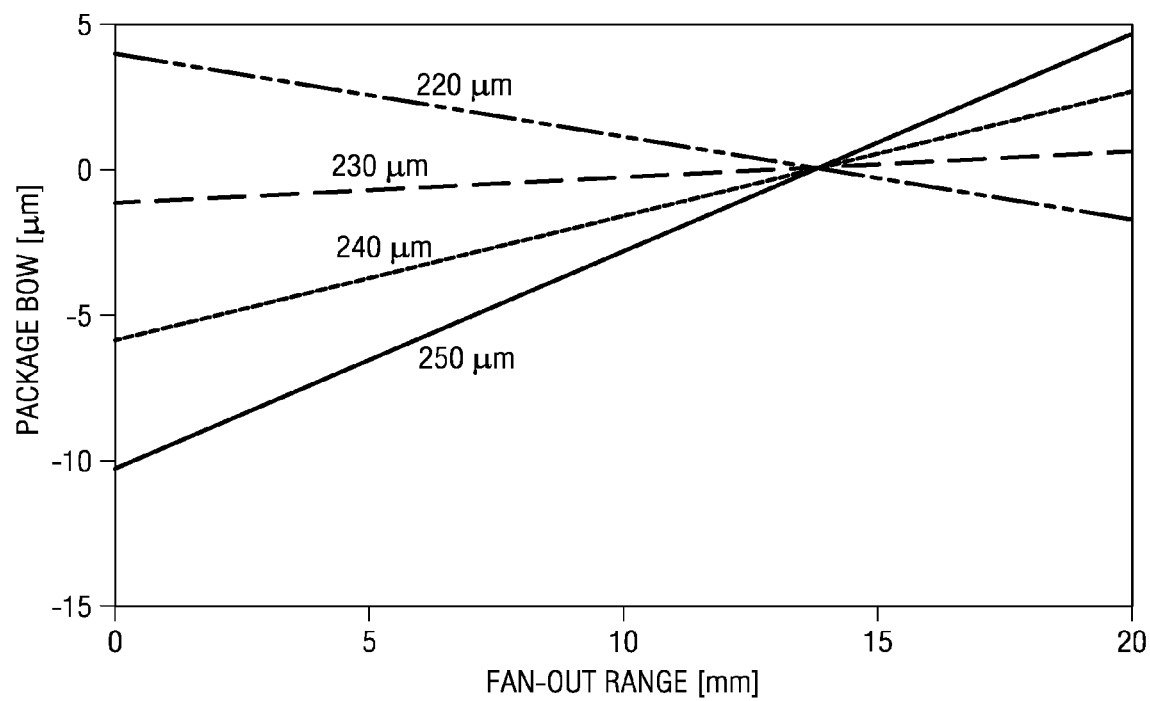
FIG. 20 is a graph illustrating that the bow shown in FIG. 19 can be compensated for by changing the top plate parameters.

In FIG. 19, the amount of overall package bow is shown at 158, before compensation. This influence can be compensated for by slightly changing the parameters, e.g., by slightly reducing the top plate 124 Young's modulus and/or CTE. FIG. 20 is a graph illustrating that the bow shown in FIG. 19 can be compensated for by changing the top plate parameters, using the materials properties shown in Table 4, and by selecting a second plate 124 or substrate having a thickness of about 230 μm, which exhibits substantially no bowing.

Thus, in accordance with some embodiments of the present invention, the filler material 152 may be selected to be a material that is adapted to compensate in the fan-out region 150 for a tendency to bow upon temperature fluctuation of the material stack in the central region 154 comprising at least the first plate 122, the integrated circuit 102, and the second plate 124. Including the filler material 152 in the fan-out region 150 or edge regions 156 may substantially eliminate a tendency to bow upon temperature fluctuations of the overall packaged integrated circuit 120 laterally, over region 158 of FIG. 15, in some embodiments.

FIGS. 21 through 23 show cross-sectional views of a method of packaging an integrated circuit 102 in accordance with an embodiment of the present invention, e.g., the embodiment shown in FIG. 15, wherein the second or top plate 124 comprises a polymer or mold compound. A first plate 122 is provided, as shown in FIG. 21, that may comprise a substrate having a redistribution layer (not shown) formed thereon. A plurality of solder balls may be attached to the lower part of the first plate 122, also not shown. An adhesive or buffer layer 136 is applied, and integrated circuits 102 are attached to the first plate 122 using a pick and place machine. An optional additional adhesive may placed on the integrated circuits 102 before the pick and place procedure, for electrical contact to the first plate 122. Electrical contact of the integrated circuits 102 to the first plate 122 may be accomplished by solder bumps 106 or wire bonds 118, as shown in FIG. 21.

The gap fill material 152 is deposited over the integrated circuits 102 and over the first plate 122, as shown in FIG. 22. Excess portions of the gap fill material 152 may be removed using a lithography process, or the gap fill material 152 may be dispensed and molded, for example.

The second plate 124 comprising a polymer is molded on, as shown in FIG. 23. The second plate 124 material may be molded on, printed using lithography, and/or subjected to a spin process, as examples. The packaged integrated circuits 120 are then singulated at a scribe line 144, as shown in phantom in FIG. 23.

FIGS. 24 through 26 show cross-sectional views of a method of packaging the integrated circuit 102 shown in FIG. 15 in accordance with another embodiment of the present invention, wherein the top or second plate 124 comprises a metal. A first plate 122 is provided, as shown in FIG. 24, that may comprise a substrate having a redistribution layer (not shown) formed thereon. A plurality of solder balls may be attached to the lower part of the first plate 122, also not shown. An adhesive or buffer layer 136 is applied, optionally over the entire first plate 122, as shown. The integrated circuits 102 are attached to the first plate 122 using a pick and place machine. Electrical contact is then made of the integrated circuits 102 to the first plate 122.

The gap fill material 152 is deposited over the integrated circuits 102 and over the first plate 122, as shown in FIG. 22. Excess portions of the gap fill material 152 may be removed using a lithography process, or the gap fill material 152 may be dispensed and molded, for example.

The second plate 124 comprising a metal is mounted over the gap fill material 152 and the integrated circuits 102, as shown in FIG. 26. The second plate 124 material may comprise a metal plate such as copper or an RCC foil. An adhesive or buffer layer 132 comprising adhesive lamination may be used to attach the second plate 124 to the integrated circuits 102 and gap fill material 152. The packaged integrated circuits 120 are then singulated at a scribe line 144, as shown in phantom in FIG. 26.

Figure 27:
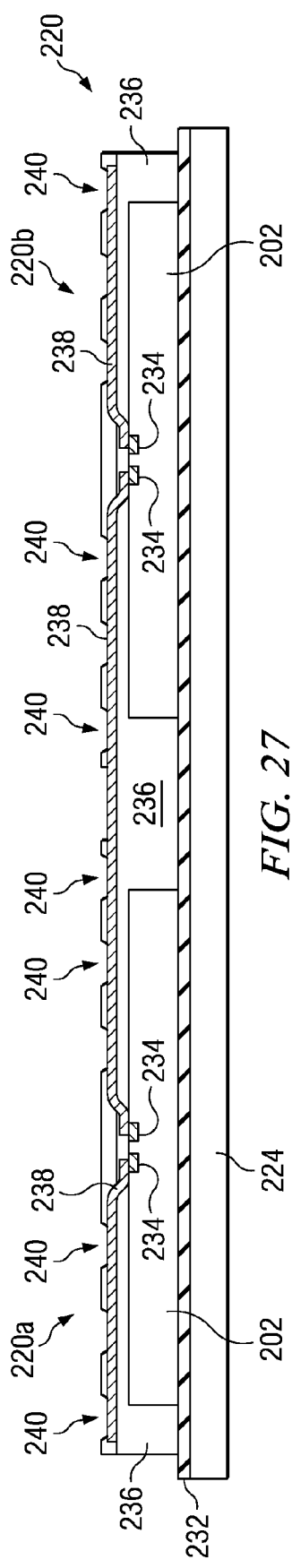
FIGS. 27 through 29 show cross-sectional views of a method of packaging multiple integrated circuits using lateral connections in accordance with an embodiment of the present invention at various stages.
Figure 28:
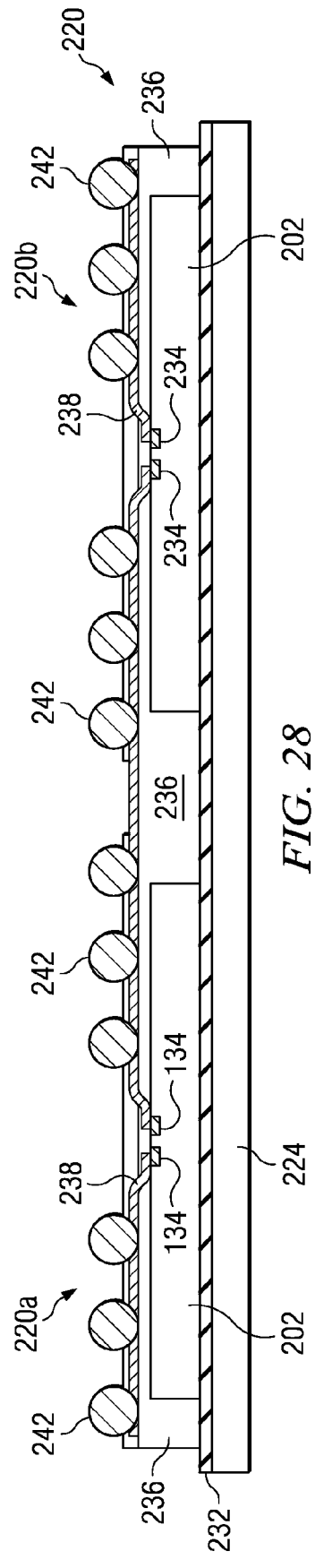
Figure 29:
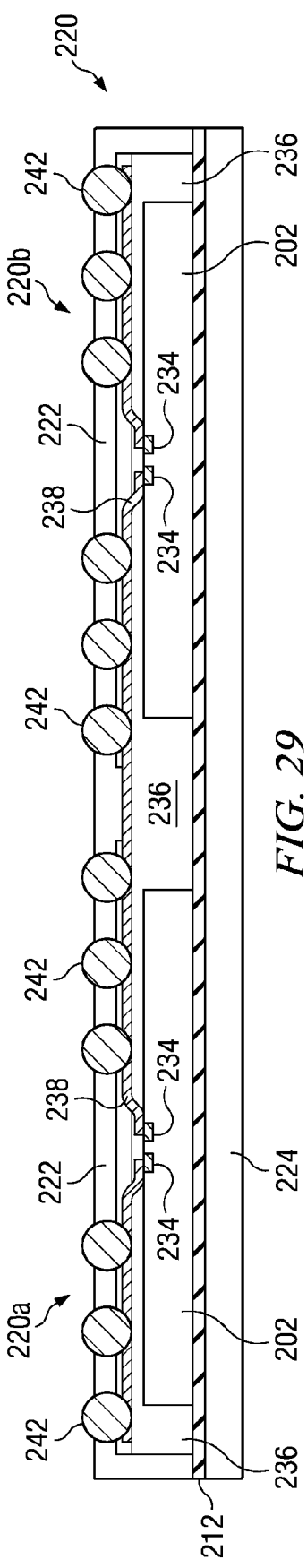
Figure 35:
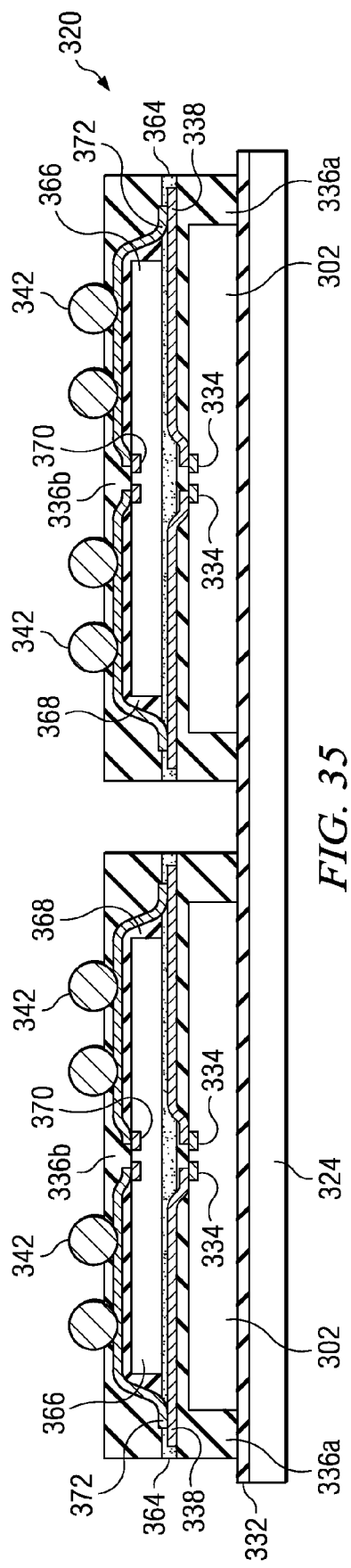
Figure 36:
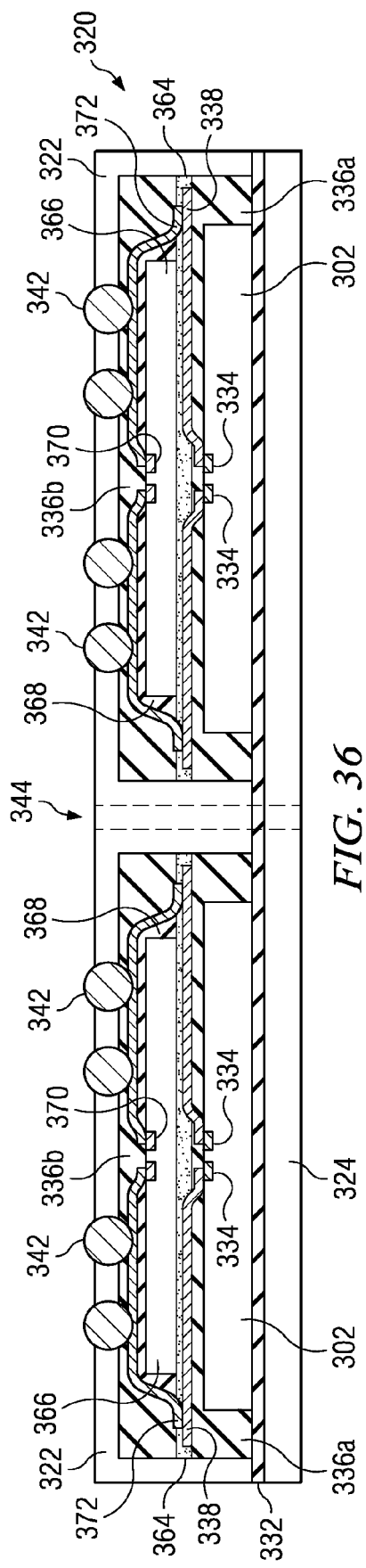

Embodiments of the present invention may be implemented in multi-chip packaging, using lateral wiring or by stacking the integrated circuits, e.g., by wiring around the chips and/or using through-silicon vias. For example, FIGS. 27 through 29 show cross-sectional views of a method of packaging multiple integrated circuits 202 using lateral connections in accordance with an embodiment of the present invention. Like numerals are used for the various elements that were used to describe FIGS. 27 through 29. To avoid repetition, each reference number shown in FIGS. 27 through 29 is not described again in detail herein. Rather, similar element numbers x02, x22, x24, etc. . . . are used to describe the various material layers shown as were used to describe FIGS. 27 through 29, where x=1 in FIGS. 5 through 26 and x=2 in FIGS. 27 through 29.

After the manufacturing process steps shown in FIGS. 7 and 8, thin film wiring 238 is formed over the buffer layer 236, as shown in FIG. 27. Portions of the thin film wiring 238 connect together two or more integrated circuits 202. Groups of the integrated circuits 202 may be electrically connected together in clusters, for example. Solder stop 240 may be printed on the thin film wiring 238, and solder balls 242 are then applied and the solder is reflowed, as shown in FIG. 28. The plate 222 is formed over the solder balls 242, as shown in FIG. 29. The plate 222 may comprise a top polymer cover on wall tooling to generate exposed solder balls 242, for example. The devices are then singulated using a dicing process into the connected integrated circuit clusters, forming a multi-chip semiconductor device 220.

Thus, planar multichip packaging systems 220 may be formed in accordance with an embodiment of the present invention, by extending the electrical connections during the wiring step to form the thin film wiring 238 to a chip-to-chip connection. By redesigning the thin film wiring 238 or RDL, two or more integrated circuits 202 may be connected in-plane, in a horizontal direction in the views shown in FIGS. 27 through 29.

Integrated circuits may also be stacked vertically in the novel packaging systems in accordance with other embodiments of the present invention. For example, FIGS. 30 through 36 show cross-sectional views of a 3D method of packaging multiple integrated circuits 302 and 366 in accordance with an embodiment of the present invention. Again, like numerals are used for the various elements that were used to describe the previous drawings, and to avoid repetition, each reference number shown in FIGS. 30 through 36 is not described again in detail herein.

The integrated circuits 302 comprise first level integrated circuits 302 in this embodiment. Buffer layer 336a comprises a first portion of the buffer layer 336a/336b in this embodiment. After the manufacturing process steps shown in FIGS. 7 through 9, an adhesive 364 is applied over the thin film wiring 338, as shown in FIG. 30. Second level integrated circuits 366 are then mounted over the adhesive 364, over the first level integrated circuits 302, as shown in FIG. 31, e.g., using a pick and place machine. A buffer layer 368 comprising a polymer or other materials described for buffer layers 132 and 136 is formed over the second level integrated circuits 366, as shown in FIG. 32. The buffer layer 368 is patterned using lithography to expose bond pads 370 on the second level integrated circuits 366. Thin film wiring 372 is formed over the buffer layer 368, as shown in FIG. 33. The thin film wiring 372 electrically couples the second level integrated circuits 366 to the first level integrated circuits 302. A second portion 336b of buffer layer 336a/336b is formed over thin film wiring 372, and an optional solder stop 374 is formed over the thin film wiring 372, as shown in FIG. 34. Solder balls 342 are formed over the thin film wiring 372 (FIG. 35), and a plate 322 is formed over the solder balls 342 (FIG. 36), as described for the previous embodiments. The packaged 3D integrated circuits 320 are then singulated at scribe line 344, shown in phantom.

FIGS. 37 through 42 show cross-sectional views of a package-to-package 490 method of packaging multiple integrated circuits in accordance with another embodiment of the present invention. Again, like numerals are used for the various elements that were used to describe the previous drawings, and to avoid repetition, each reference number shown in FIGS. 37 through 42 is not described again in detail herein. The packages comprise wafer level BGA packages with top and bottom side contacts, and two integrated circuits are mounted together in a "package-on-package" structure.

A plate 424 is provided having a plurality of through-hole vias 475 formed therein. The plate 424 comprises a substrate which functions as a carrier in this embodiment. The plate 424 may comprise a pre-molded back-end wafer, for example. The plate 424 may also comprise a copper wafer or other metal wafer, as another example. The buffer layer 432 is formed or printed on the plate 424, and integrated circuits 402 are disposed over the buffer layer 424, e.g., using a pick and place machine. Buffer layer 436 is formed over the integrated circuits 402 and patterned to expose the bond pads 434 of the integrated circuits 402, as shown in FIG. 38. Thin film wiring 438 is formed over the buffer layer 436, as shown in FIG. 39. Optional wire bonds 476 may be used to couple the thin film wiring 438 to the through-hole vias 475, as shown on the left side of FIG. 39. Alternatively, the thin film wiring 438 may be patterned so that the thin film wiring 438' is coupled to the through-hole vias 475, as shown on the right side of FIG. 39. Optional solder stop 474 may be formed, and solder balls 442 are formed over the thin film wiring 438, as shown in FIG. 40. Plate 422 is then formed over the solder balls 442 and thin film wiring 438, as shown in FIG. 41, and the solder balls 442 may be partially embedded in the plate 422. The packaged integrated circuits 420 are then singulated at scribe lines 444 shown in phantom using a dicing process.

Figure 42:
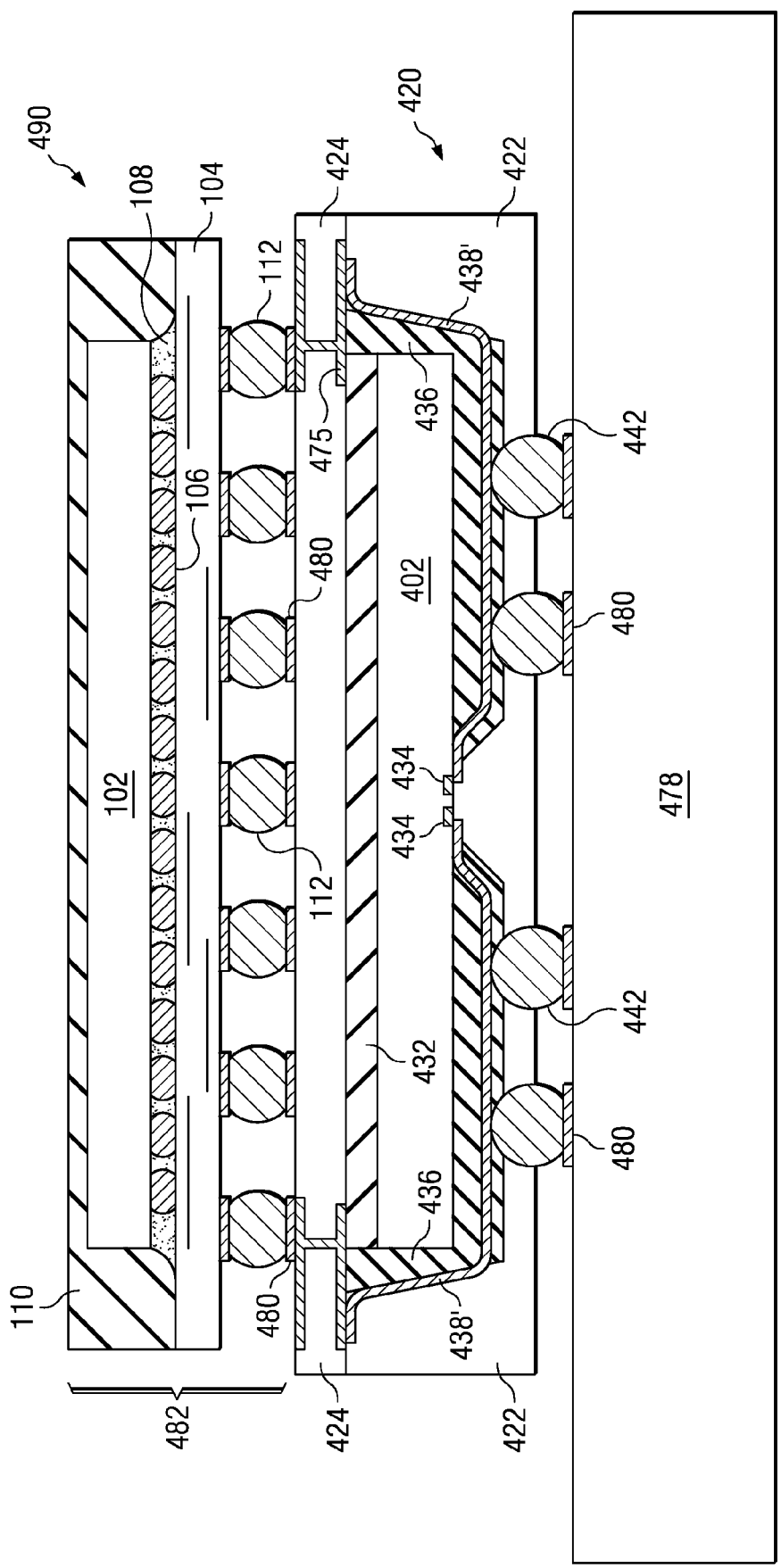

The packaged integrated circuits 420 may then be mounted to another packaged integrated circuit 482 in a package-to-package 490 configuration, as shown in FIG. 42. The packaged integrated circuit 482 may comprise an integrated circuit 102 packaged in a variety of different types of packages, such a flip chip package, as shown (see FIG. 1), a BGA package, or the novel CTE-balanced packaging systems 120, 220, 320, and 420 described herein. Solder balls 112 of the packaged integrated circuit 482 may be coupled to bond pads 480 and through-hole vias 475 of the packaged integrated circuits 420, as shown. The solder balls 442 of the packaged integrated circuits 420 may be coupled to bond pads 480 of a board 478 in an end application, such as a printed wiring board (PWB), PCB, or substrate, for example. Advantageously, the through-hole vias 475 in plate 424 allow connections to both sides of the packaging system 420 in this embodiment.

The previous embodiments described herein may also be coupled to a board 478 in an end application using solder balls 142, 242, and 342, not shown. In some embodiments, the materials of the plates 122, 124, 222, 224, 322, 324, 422, and 424 may be selected to match the CTE of the board 478 in the end application, to prevent bowing and warping at the end application level, preventing breakage or disconnection of the solder balls 142, 242, 342, 442 to pads 480 on the board 478.

The embodiments shown in FIGS. 27 through 29, 30 through 36, and 37 through 42 may also be manufactured that include a gap fill material 152 in the edge regions 156 comprising fan-out regions 150, as described for the embodiments shown in FIGS. 15, 21 through 23, and 24 through 26, for example, not shown in the drawings.

Embodiments of the present invention are described herein as being implemented in semiconductor devices, e.g., in the packaging of semiconductor chips or integrated circuits 102, 202, 302, or 402. Embodiments of the present invention may also be implemented in other technologies where bow-free packaging is desired. The packaged integrated circuits 120, 220, 320, or 420 may be used to replace BGA, LGA, or other wafer level packaging. The packaging systems 120, 220, 320, or 420 may be used with memory devices, logic, and other types of integrated circuits.

The processing of the packaged integrated circuits 120, 220, 320, or 420 may be performed highly parallel on a panel level, wherein the panel level may be a round wafer or a rectangular panel. The panel level may comprise a round wafer, e.g., 200 or 300 mm, as in semiconductor processing in some embodiments. The panel level may alternatively comprise a rectangular panel, e.g., 300 or 400 mm, as in the PWB industry, as another example.

Advantages of embodiments of the invention include providing novel packaging systems 120, 220, 320, and 420 and methods that prevent bowing of the packaged integrated circuit 120, 220, 320, or 420. The packaging systems 120, 220, 320, or 420 may be implemented in a variety of panel sizes, e.g., at a wafer level or printed circuit board level. The packaging systems 120, 220, 320, and 420 may be packaged mechanically in JEDEC standard package outlines. In some embodiments, the packaging systems 120, 220, 320, and 420 do not include substrates or interposers, for example.

The packaging systems 120, 220, 320, and 420 have improved reliability and fewer failures due to the stress adaptation and compensation. The packaging systems 120, 220, 320, and 420 may replace standard BGA and flip chip packages, because the wiring between the integrated circuit and solder balls comprises thin film wiring 138, which comprises fine pitch thin film metallization, formed by lithography definition. High pin count, fan-in, and fan-out wiring schemes are possible with embodiments of the present invention.

The methods of manufacturing the packaging systems 120, 220, 320, and 420 described herein may advantageously be processed with existing tooling in many manufacturing facilities.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A packaging system for an integrated circuit, comprising:
   a first plate having a first coefficient of thermal expansion;
   a first buffer layer disposed between an upper side of the first plate and a lower side of the integrated circuit;
   thin film wiring mounted on the first plate and adapted to pass directly through the first buffer layer to couple bond pads on the lower side of the integrated circuit to associated solder balls mounted on a lower side of the first plate;
   a second buffer layer disposed directly above an upper side of the integrated circuit; and
   a second plate mounted directly over the second buffer layer, the second plate having a second coefficient of thermal expansion, the second coefficient of thermal expansion being substantially the same as the first coefficient of thermal expansion.

2. The packaging system according to claim 1, wherein the first buffer layer has a third coefficient of thermal expansion, wherein the second buffer layer has a fourth coefficient of thermal expansion, the fourth coefficient of thermal expansion being substantially the same as the third coefficient of thermal expansion.

3. The packaging system according to claim 1, wherein the first buffer layer has a predetermined first thickness, the second buffer layer has a predetermined second thickness, and the first thickness and the second thickness are substantially equal.

4. The packaging system according to claim 1, wherein the first buffer layer or the second buffer layer comprise an adhesive, tape, silicone, polyimide, Elastosil™, epoxy, elastic polymer, or a combination thereof.

5. The packaging system according to claim 1, wherein the first plate or the second plate comprise a semiconductor substrate or a printed circuit board substrate.

6. The packaging system according to claim 1, wherein the first plate or the second plate comprise a polymer, a metal, or a silicon-enriched mold compound.

7. The packaging system according to claim 1, wherein the first plate has a predetermined first thickness, wherein the second plate has a predetermined second thickness, and the first thickness and the second thickness are substantially equal.

8. The packaging system according to claim 1, wherein the packaging system comprises a ball grid array package, a land grid array package, or a wafer level package.

9. A semiconductor device, comprising:
a first plate, the first plate comprising a first coefficient of thermal expansion;
a first buffer layer disposed over the first plate;
at least one integrated circuit disposed over the first buffer layer;
a second buffer layer disposed directly over the at least one integrated circuit;
a second plate disposed directly over the second buffer layer, the second plate comprising a second coefficient of thermal expansion, the second coefficient of thermal expansion being substantially the same as the first coefficient of thermal expansion; and
thin film wiring mounted on the first plate and adapted to pass directly through the first buffer layer to couple bond pads on a lower side of the at least one integrated circuit to associated solder balls mounted on a lower side of the first plate.

10. The semiconductor device according to claim 9, wherein the at least one integrated circuit comprises a plurality of integrated circuits and wherein at least two of the plurality of integrated circuits are electrically coupled by the thin film wiring.

11. The semiconductor device according to claim 9, wherein the solder balls are partially embedded in the first plate.

12. The semiconductor device according to claim 9, wherein the solder balls are embedded in the first plate by about 30% or greater.

13. The semiconductor device according to claim 9, wherein the first plate has a first Young's modulus, wherein the second plate has a second Young's modulus, wherein the second Young's modulus is substantially equal to the first Young's modulus.

14. The semiconductor device according to claim 9, wherein at least one of the first plate or the second plate includes a plurality of through-hole vias adapted to couple the at least one integrated circuit to associated bond pads on an external surface of the first plate or the second plate.

* * * * *